US008063667B2

(12) United States Patent
Tomita

(10) Patent No.: US 8,063,667 B2
(45) Date of Patent: Nov. 22, 2011

(54) PEAK HOLD CIRCUIT

(75) Inventor: Kazuhiro Tomita, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 54 days.

(21) Appl. No.: 12/483,579

(22) Filed: Jun. 12, 2009

(65) Prior Publication Data
US 2009/0322379 A1    Dec. 31, 2009

(30) Foreign Application Priority Data
Jun. 27, 2008 (JP) .................................. 2008-168726

(51) Int. Cl.
*G01R 19/00* (2006.01)

(52) U.S. Cl. .......................................... 327/58; 327/91
(58) Field of Classification Search .................. None
See application file for complete search history.

(56) References Cited

U.S. PATENT DOCUMENTS

| 7,109,466 | B2 * | 9/2006 | Park et al. .................. 250/214 A |
| 7,518,414 | B2 * | 4/2009 | Romero et al. ................. 327/96 |
| 7,560,959 | B2 * | 7/2009 | Paraschou et al. .............. 327/72 |
| 7,573,322 | B2 * | 8/2009 | Gatta et al. .................... 327/538 |

FOREIGN PATENT DOCUMENTS
JP    05-126869 A    5/1993
* cited by examiner

*Primary Examiner* — Lincoln Donovan
*Assistant Examiner* — Sibin Chen
(74) *Attorney, Agent, or Firm* — Fujitsu Patent Center

(57) ABSTRACT

A peak hold circuit includes an input transistor, which is provided with an input signal, and a first hold capacitor, which holds a maximum or minimum value of the input signal. A correction circuit, which corrects the hold voltage held by the first hold capacitor, includes an operational amplifier, which is supplied with the hold voltage, and a correction transistor, which is provided with an output signal of the operational amplifier. A source/emitter of the correction transistor is coupled to the operational amplifier. The peak hold circuit also includes a current detection circuit, which detects current flowing to the input transistor, and a peak current hold circuit, which holds the peak value of the current detected by the current detection circuit as a peak current and supplies the peak current to the correction transistor.

13 Claims, 14 Drawing Sheets

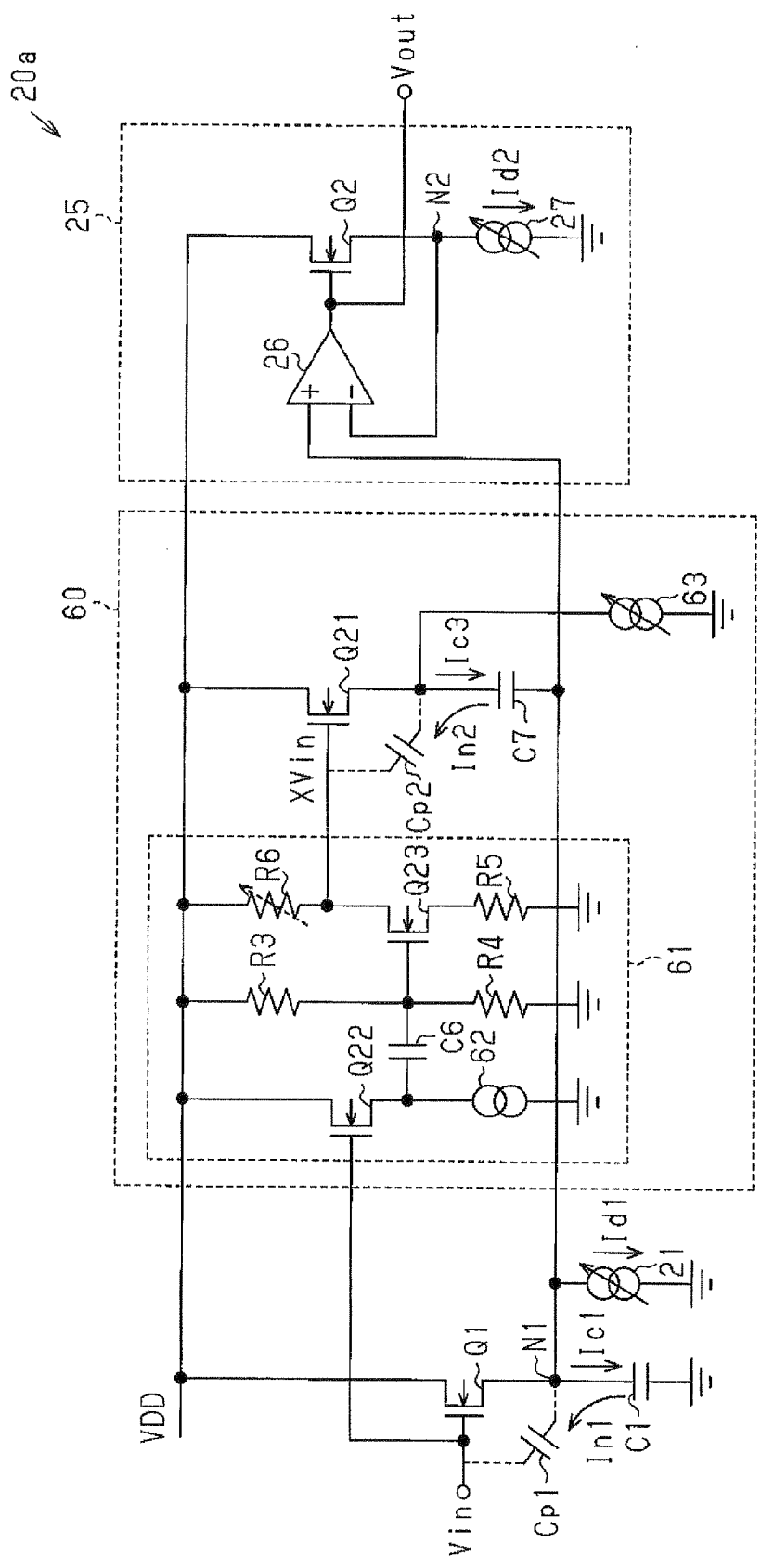

PEAK HOLD CIRCUIT

CROSS-REFERENCE TO RELATED APPLICATIONS

This application is based upon and claims the benefit of priority from prior Japanese Patent Application No. 2008-168726, filed on Jun. 27, 2008, the entire contents of which are incorporated herein by reference.

FIELD

The embodiments discussed herein relate to a peak hold circuit.

BACKGROUND

A peak hold circuit shown in FIGS. 1 and 2 and known in the art is used for generating an output signal that is in accordance with a peak value (maximum value) of an input signal.

In a peak hold circuit 150 shown in FIG. 1, an input signal Vin, which is a voltage signal, is provided to an inversion input terminal of an operational amplifier 151. An output terminal of the operational amplifier 151 is coupled to a gate of a P-channel MOS transistor Q30 functioning as a charge pump.

The source of the transistor Q30 is coupled to a high potential power supply VDD, and the drain of the transistor Q30 is coupled to ground via a capacitor C serving as a hold capacitor. A current source 152, which controls the droop rate (reduction rate) of the hold voltage for the capacitor C, is coupled in parallel to the capacitor C. A node N between the transistor Q30 and the capacitor C is coupled to an output terminal of the peak hold circuit 150 via a buffer circuit 153. The peak value of the input signal Vin held in the capacitor C is output from the output terminal as the output signal Vout.

In the peak hold circuit 150, the transistor Q30 is activated when the input signal Vin becomes higher than the hold voltage of the capacitor C (potential of the node N), and the capacitor C is charged by the charging current flowing to the capacitor C. The charging of the capacitor C is stopped when the hold voltage of the capacitor C becomes equal to the voltage of the input signal Vin. When the voltage of the input signal Vin becomes lower than the voltage of the capacitor C, the transistor Q30 is inactivated and the capacitor C is uncoupled from the operational amplifier 151. This holds the present hold voltage of the capacitor C, that is, the peak value of the input signal Vin, and the peak voltage is output from the output terminal as the output signal Vout. When the input signal Vin again becomes higher than the hold voltage of the capacitor C, the transistor Q30 is activated, the capacitor C is charged, and the peak value is updated. Therefore, the operational amplifier 151 and the transistor Q30 form a feedback loop in the peak hold circuit 150, and the input signal Vin and the output signal Vout (hold voltage of the capacitor C) are constantly compared. The accuracy of the peak detection is thus high. The hold voltage of the capacitor C is gradually discharged by a droop current Id of the current source 152 during the hold period.

In a peak hold circuit 160 shown in FIG. 2, the input signal Vin, which is a voltage signal, is provided to a base of an input transistor Q31, which is an NPN transistor. The collector of the input transistor Q31 is coupled to a high potential power supply VDD, and the emitter is coupled to ground via a capacitor C1 serving as a hold capacitor A current source 161 for controlling the droop rate of the hold voltage of the capacitor C1 is coupled in parallel to the capacitor C1. A node N1 between the input transistor Q31 and the capacitor C1 is coupled to a non-inversion input terminal of an operational amplifier 166.

The output signal of the operational amplifier 166 is provided to a base of a correction transistor Q32, which is an NPN transistor, and also output from the output terminal of the peak hold circuit 160 to an external circuit (not shown) as the output signal Vout. The collector of the correction transistor Q32 is coupled to the high potential power supply VDD, and the emitter is coupled to ground via a current source 167. A node N2 between the correction transistor Q32 and the current source 167 is coupled to the inversion input terminal of the operational amplifier 166. The operational amplifier 166, the correction transistor Q32, and the current source 167 function as a correction circuit 165 for correcting the hold voltage of the capacitor C1 to substantially the same potential as the peak value of the input signal Vin.

In the peak hold circuit 160, when the input signal Vin is input to the input transistor Q31, the capacitor C1 is charged to a potential lower than the voltage of the input signal Vin by an amount corresponding to a forward voltage of a diode (formed between base-emitter of the input transistor Q31). The diode is inactivated when the potential difference between the input signal Vin and the hold voltage of the capacitor C1 (potential of the node N1) becomes lower than the forward voltage of the diode. In this case, the capacitor C1 is not charged, and the capacitor C1 is uncoupled from the input transistor Q31. This holds the present voltage of the capacitor C1 as the hold voltage. However, the hold voltage of the capacitor C1 is lower than the peak value of the input signal Vin by an amount corresponding to the forward voltage of the diode. Therefore, a correction circuit 165 corrects the hold voltage of the capacitor C1 to be substantially the same potential as the peak value of the input signal Vin and then outputs the corrected voltage as the output signal Vout. In other words, a node N1 and a node N2 are controlled to have the same potential by the feedback loop, which is formed by the correction transistor Q32 having the same element size as the input transistor Q31 and the operational amplifier 166. The base voltage of the transistor Q32 then becomes higher than the voltage of the node N2 (voltage of the node N1) by an amount corresponding to the forward voltage of the diode. As a result, the hold voltage of the capacitor C1 is corrected to have substantially the same potential as the peak value of the input signal Vin and is output as the output voltage Vout.

In this manner, in an analog circuit in which the amplitude of the input signal is not constant, the peak hold circuits 150 and 160 detect the envelope of the input signal or optimize the gain of the amplification circuit by detecting the peak value of the input signal. Thus, the peak hold circuit is used in various types of circuits. Japanese Laid-Open Patent Publication No. 5-126869 describes such a peak hold circuit.

However, the peak hold circuits 150 and 160 have the shortcomings described below.

To detect a peak, the peak hold circuit 150 shown in FIG. 1 needs to compare the input signal Vin and the previous peak value (hold voltage of the capacitor C) and activate the transistor Q30 with a signal that is in accordance with the comparison result. Thus, such feedback loop requires a relatively long time to charge the capacitor C. Such feedback loop limits the response characteristics (e.g., of the operational amplifier 151). Thus, the peak value cannot be held in an ensured manner if the input signal Vin is a high-speed signal. Specifically, if the input signal Vin is a high-speed signal, the period in which the input signal Vin becomes greater than the hold voltage of the capacitor C, that is, the ON period of the transistor Q30 becomes relatively short. In this case, if the timing for activating the transistor Q30 is delayed due to the feedback loop, the charging time of the capacitor C is shortened, and the peak detection operation ends before holding the peak value of the input voltage Vin. As a result, the peak value of the input signal Vin cannot be held in an ensured manner.

In the peak hold circuit 160 shown in FIG. 2, the response speed is fast since the peak is detected by a simple circuit configuration formed by the transistor Q31 and the capacitor C1. Therefore, the peak hold circuit 160 is suitable for high-speed operations However, since the hold voltage of the capacitor C1 is lower than the peak value of the actual input signal Vin by an amount corresponding to the forward voltage of the diode of the transistor Q31, the accuracy of peak detection is low. To improve the accuracy, the correction circuit 165 shown in FIG. 2 corrects the hold voltage of the capacitor C1 by compensating for the difference of the amount corresponding to the forward voltage of the diode. However, in the peak hold circuit 160, a difference occurs in the base-emitter voltages of the transistors Q31 and Q32 since the bias conditions are not the same in the input transistor Q31 and the correction transistor Q32. This lowers the accuracy of the hold voltage corrected by the correction circuit 165. This directly affects the output signal Vout and consequently lowers the accuracy of peak detection.

Such problems are not limited to a peak hold circuit that holds the maximum value of the input signal Vin and also arise in a peak hold circuit that holds the minimum value (peak value) of an input signal.

SUMMARY

According to an aspect of the embodiments, a peak hold circuit includes a peak hold unit including an input transistor which is provided with an input signal, and a first hold capacitor which holds a maximum value or a minimum value of the input signal. A correction circuit corrects a hold voltage held in the first hold capacitor. The correction circuit includes an operational amplifier which is supplied with the hold voltage, and a correction transistor which is provided with an output signal of the operational amplifier and which has a source/emitter coupled to the operational amplifier A current detection circuit detects a current flowing to the input transistor. A peak current hold circuit holds a peak value of the current detected by the current detection circuit as a peak current and supplies the peak current to the correction transistor.

Additional objects and advantages of the invention will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF DRAWINGS

The invention, together with objects and advantages thereof, may best be understood by reference to the following description of the presently preferred embodiments together with the accompanying drawings in which:

FIG. 15 is a schematic circuit diagram of a peak hold circuit of a sixth embodiment;

DESCRIPTION OF EMBODIMENTS

Figure 1:
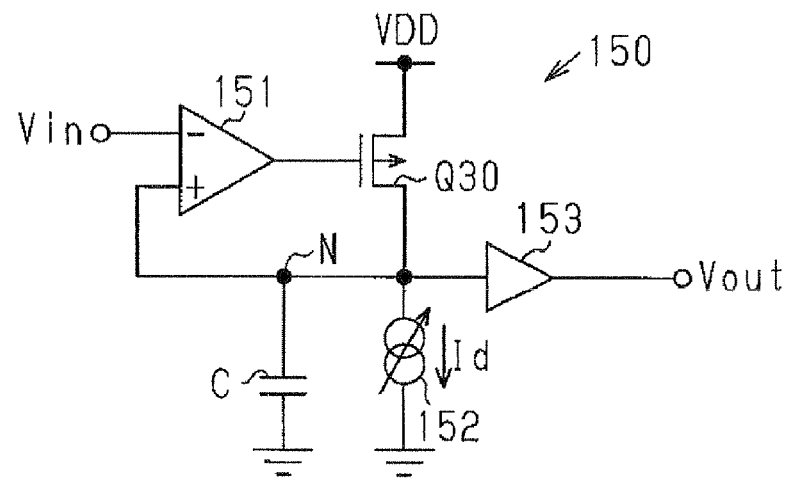
FIG. 1 is a circuit diagram of a peak hold circuit in the prior art.

In the drawings, like numerals are used for like elements throughout.

First Embodiment

A first embodiment of a peak hold circuit will now be discussed with reference to FIGS. 3 to 7. The peak hold circuit is applicable to an Auto Power Control (APC) circuit for an optical disc device that records and reproduces data on an optical disc such as Digital Versatile Disc (DVD). The APC circuit determines the difference between a laser beam level detected by a photodetector and a preset target value to adjust the drive current generated by a laser driver in accordance with the difference and maintain the laser power from the laser diode at the target value. For example, the APC circuit performs APC when recording data onto the optical disc.

Figure 3:
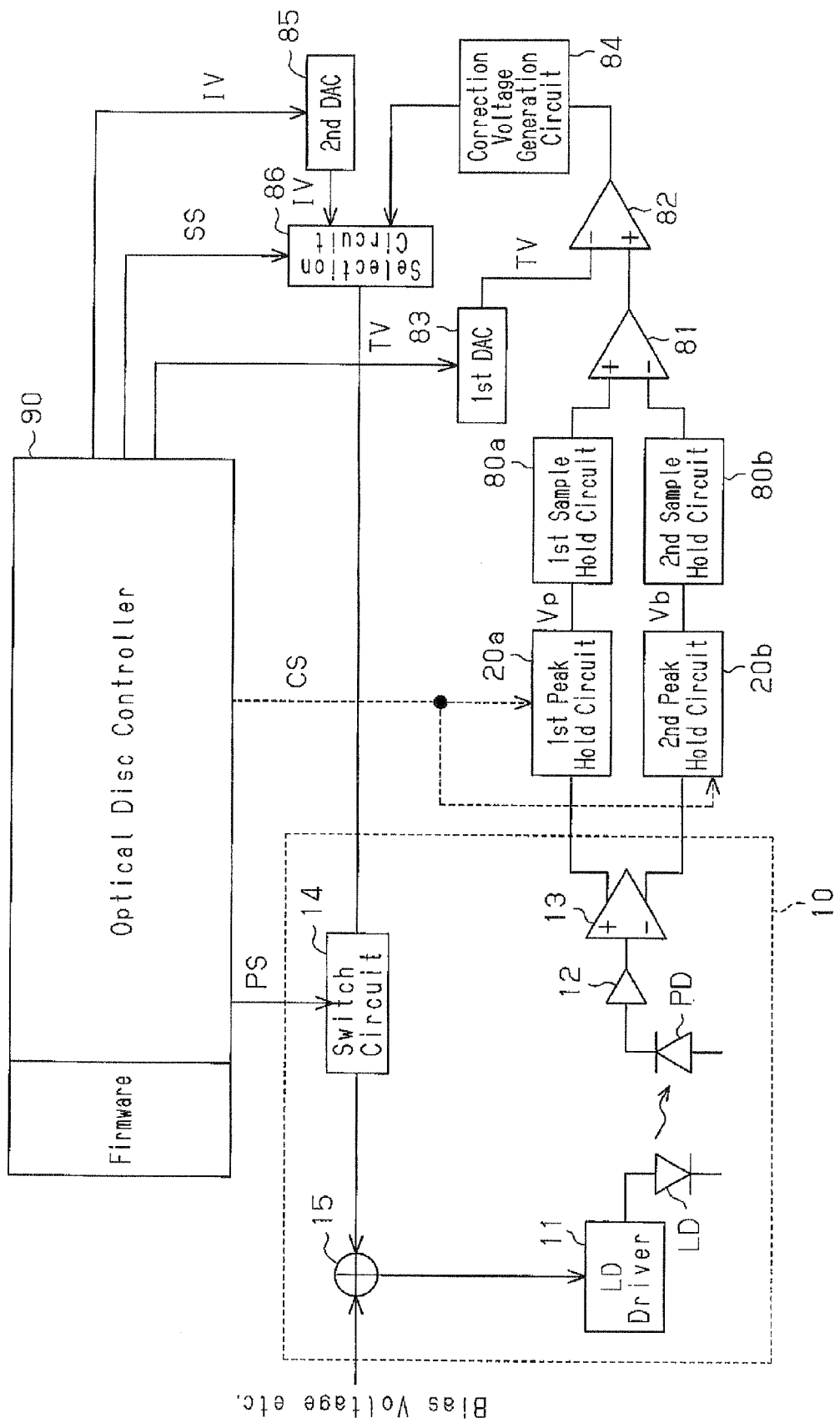
FIG. 3 is a schematic block diagram of an APC circuit showing one application of a peak hold circuit.
Figure 4:
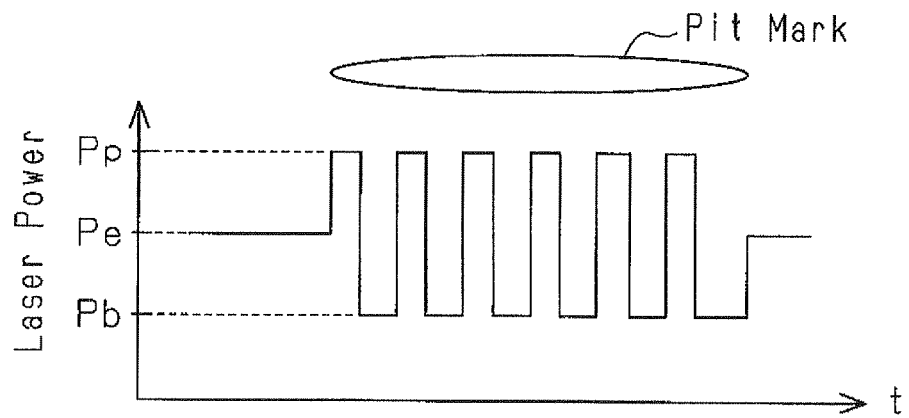
FIG. 4 is a conceptual diagram of laser power during recording.

Referring to FIG. 3, a laser diode LD in an optical pickup 10 emits a laser beam for recording information to the optical disc based on drive current supplied from an LD driver 11. A multipath technique shown in FIG. 4 is used to drive the laser diode LD. In other words, the laser diode LD forms pit marks by repeatedly generating a peak power Pp and a bias power Pb, as shown in FIG. 4. The laser diode LD also forms a space by generating an erase power Pe.

Referring to FIG. 3, the photodetector PD receives part of the laser beam emitted from the laser diode LD to the optical disc to generate a light-receiving current (front monitor signal), which is proportional to the received amount of light. The photodetector PD outputs the front monitor signal to a preamplifier 12. The preamplifier 12 converts the front monitor signal from the photodetector PD to a voltage signal and outputs the voltage signal to a differential output amplifier 13.

The differential output amplifier 13 converts the voltage signal provided from the preamplifier 12 to a differential signal including a non-inverted signal and an inverted signal of the voltage signal. The differential output amplifier 13 then provides the non-inverted signal to a first peak hold circuit 20a and the inverted signal to a second peak hold circuit 20b.

The first peak hold circuit 20a holds the peak value (maximum value) of the non-inverted signal from the differential output amplifier 13 as a peak voltage Vp and outputs the peak voltage Vp to a first sample hold circuit 80a. The second peak hold circuit 20b holds the peak value (minimum value) of the inverted signal from the differential output amplifier 13 as a bottom voltage Vb and outputs the bottom voltage Vb to a second sample hold circuit 80b.

The first sample hold circuit 80a samples and holds the peak voltage Vp from the first peak hold circuit 20a at a given timing (e.g., period a peak power Pp is output) and outputs the sample hold voltage to a non-inversion input terminal of a differential input amplifier 81. The second sample hold circuit 80b samples and holds the bottom voltage Vb from the second peak hold circuit 20b at the given timing (e.g., period the peak power Pp is output) and outputs the sample hold voltage to an inversion input terminal of the differential input amplifier 81.

The differential input amplifier 81 generates a differential voltage signal by amplifying a differential voltage of the two sample hold voltages from the first and second sample hold circuits 80a and 80b and outputs the differential voltage signal to a non-inversion input terminal of an error amplifier 82. The inversion input terminal of the error amplifier 82 is provided with a target value TV from a first D/A converter (DAC) 83. The target value TV provided from the first DAC 83 is set by an optical disc controller 90.

The error amplifier 82 detects an error between the differential voltage signal from the differential input amplifier 81 and the target value TV from the first DAC 83 and outputs an error signal to a correction voltage generation circuit 84. The correction voltage generation circuit 84 generates a correction voltage in accordance with the error signal from the error amplifier 82. For example, the correction voltage generation circuit 84 lowers the correction voltage when the error signal is raised, and raises the correction voltage when the error signal is lowered. The laser power of the laser diode LD is maintained at a target value by increasing or decreasing the drive current of the LD driver 11 in accordance with the correction voltage generated based on the error signal. In the first embodiment, the first and second peak hold circuits 20a and 20b, the first and second sample hold circuits 80a and 80b, the amplifiers 81 and 82, the correction voltage generation circuit 84, the first and second DACs 83 and 85, and a selection circuit 86 configure an APC circuit.

The selection circuit 86 receives an initial value IV set by the optical disc controller 90 and the correction voltage generated by the correction voltage generation circuit 84. The initial value IV is provided to the selection circuit 86 via the second DAC 85. The selection circuit 86 outputs the correction voltage from the correction voltage generation circuit 84 or the initial value IV from the second DAC 85 to a switch circuit 14 in the optical pickup 10 in accordance with a selection signal SS provided from the optical disc controller 90.

The activation and inactivation of the switch circuit 14 is controlled in accordance with a light emission pulse signal PS provided from the optical disc controller 90. In the activated state, the switch circuit 14 outputs the correction voltage (or initial value IV) provided from the selection circuit 86 to an adder 15. The light emission pulse signal PS provided from the optical disc controller 90 is generated based on recording data written to the optical disc.

The adder 15 adds a bias voltage or the like, which is for generating light with the bias power Pb, to the correction voltage (or initial value IV), which is generated based on the error signal to generate a drive voltage for emitting the laser beam of the bias power Pb, the peak power Pp, or the erase power Pe. The adder 15 provides the drive voltage to the LD driver 11.

The LD driver 11 converts the drive voltage from the adder 15 into drive current and supplies the drive current to the laser diode LD to control the laser power of the laser beam from the laser diode LD. The laser diode LD thus emits the laser beam of the laser power (bias power Pb, peak power Pp, or erase power Pe) maintained at the target value.

The optical disc controller 90 controls the APC circuit and the optical pickup 10 according to a firmware stored in a program ROM. The optical disc controller 90 controls and drives the APC circuit and the optical pickup 10 at the desired timing. Specifically, the optical disc controller 90 provides the target value TV (digital value), which is used as a reference value for the correction voltage generated in the correction voltage generation circuit 84, to the first DAC 83 and provides the initial value IV (digital value) of the laser power to the second DAC 85. The initial value IV is a target prediction value calculated in accordance with the rotation speed of the disc.

The optical disc controller 90 has the selection circuit 86 select the initial value IV of the second DAC 85 with the selection signal SS in the first path when initializing the APC circuit. The initializing of the APC circuit is generally slow since it is dependent on the response time of the APC loop. Thus, in the first path when initializing the APC circuit, the drive current corresponding to the target prediction value (initial value IV) calculated in accordance with the rotation speed of the optical disc is supplied to the laser diode LD instead of the correction voltage from the correction voltage generation circuit 84. This readily initializes the APC loop Data is recorded onto an optical disc in higher densities and at higher speeds. As a result, the APC circuit must perform processing at higher speeds, and a peak hold circuit having high-speed response and high accuracy is required. Specifically, when employing multi-pulses, as the laser power of the laser beam changes at high speeds between multi-pulses, the differential signal, which is a high-speed signal, is input to the first and second peak hold circuits 20a and 20b. In this case, the peak voltage and the bottom voltage of the differential signal may not be accurately detected unless the first and second peak hold circuits 20a and 20b are applicable for high-speed response and high accuracy. As a result, the accuracy for controlling the drive current (APC control) supplied to the laser diode LD decreases. Thus, a peak hold circuit applicable for high-speed response and high accuracy is also necessary to maintain high accuracy for the APC control even when data is recorded with higher density at higher speeds.

Figure 2:
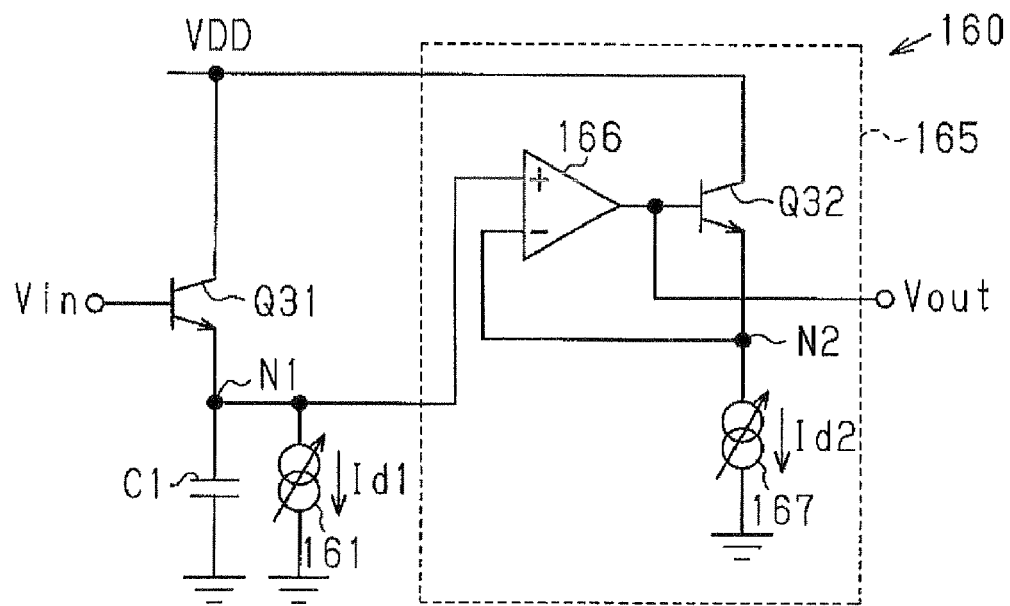
FIG. 2 is a circuit diagram of a peak hold circuit in the prior art.
Figure 5A:
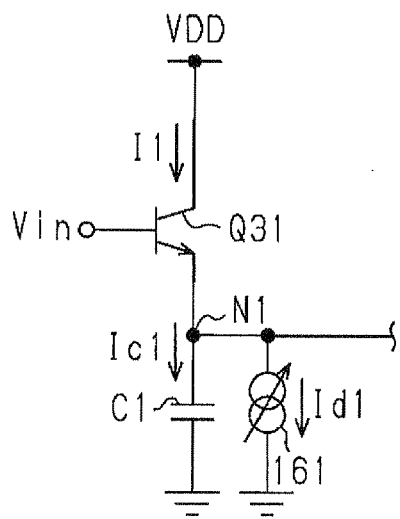
FIGS. 5A and 5B are schematic diagrams for the peak hold circuit of the prior art shown in FIG. 2.
Figure 5B:
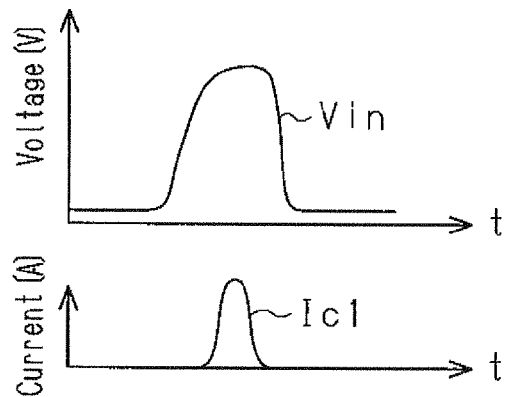
Figure 6:
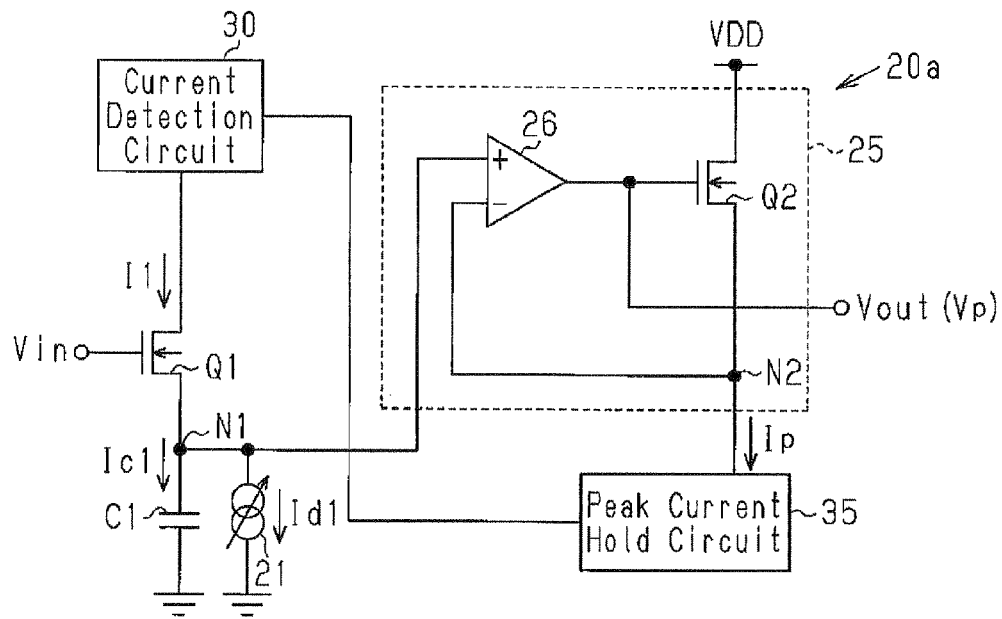
FIG. 6 is a schematic block diagram of a peak hold circuit of a first embodiment.

The peak hold circuit 150 shown in FIG. 1 has a problem in that the peak value cannot be held in an ensured manner during high-speed operations. The peak hold circuit 160 shown in FIG. 2 is applicable for high-speed operations but the accuracy of peak detection decreases due to the difference in the base-emitter voltages of the transistors Q31, Q32, as described above. With respect to the peak hold circuit 160 of FIG. 2, the inventor of the present invention has focused on the point in which the differences between the base-emitter voltages occurs because the bias conditions are not the same for the input transistor Q31 and the correction transistor Q32. In other words, the inventor has focused on the point that the current flowing to the input transistor Q31 differs from the current flowing to the correction transistor Q32. More specifically, current Ii flows to the input transistor Q31 during peak detection. The current I1 is obtained by adding the charging current Ic1, which flows to the capacitor C1 when the input signal Vi rises, and the droop current Id1 of the current source 161, as shown in FIGS. 5A and 5B. Only the droop current Id2 of the current source 167 always flows to the correction transistor Q32. Therefore, the current I1 (Ic1+Id1) flowing to the input transistor Q31 and the current Id2 flowing to the correction transistor Q32 are not the same during peak detection. In other words, the bias conditions of the transistors Q31 and Q32 are not the same. This causes the difference between the base-emitter voltages of the transistors Q31 and Q32. Therefore, the first peak hold circuit 20a of the first embodiment includes a current detection circuit 30 for detecting the current I1 that flows to the input transistor Q1 for the peak hold circuit 160 of FIG. 2, as shown in FIG. 6. Furthermore, the first peak hold circuit 20a includes a peak current hold circuit 35 for holding the peak value of the current I1 detected by the current detection circuit 30 as the peak current and supplying the peak current to the correction transistor Q2. The first peak hold circuit 20a including the current detection circuit 30 and the peak current hold circuit 35 will be described in detail with reference to FIG. 7. IN the following description, the reset circuit is omitted from the first peak hold circuit 20a.

Figure 7:
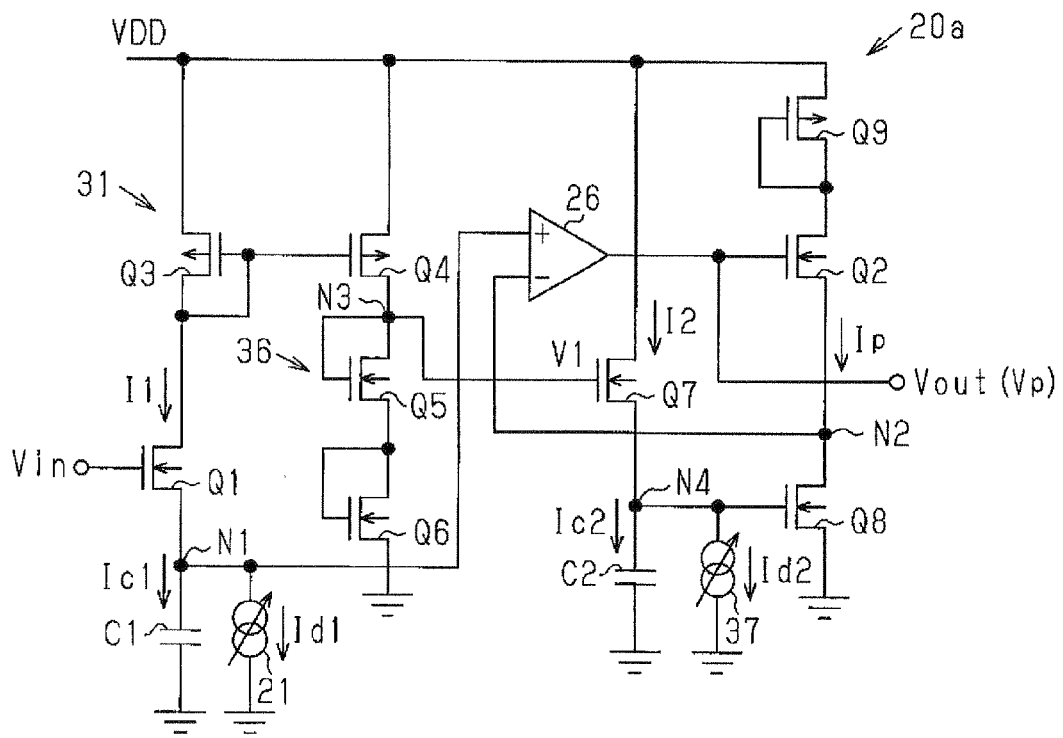
FIG. 7 is a schematic circuit diagram of the peak hold circuit of FIG. 6.

As shown in FIG. 7, a non-inverted signal from the differential output amplifier 13 (see FIG. 3) is input to the gate of the input transistor Q1 gas the input signal Vin. The input transistor Q1 is configured by an N-channel MOS transistor. The drain of the input transistor Q1 is coupled to a current mirror circuit 31, and the source is coupled to ground via a capacitor C1 serving as a voltage hold capacitor. A current source 21 for generating the droop current Id1 that controls the droop rate of the hold voltage of the capacitor C1 is coupled in parallel to the capacitor C1. The input transistor Q1, the capacitor C1, and the current source 21 form a peak hold unit.

A node N1 between the input transistor Q1 and the capacitor C1 is coupled to a non-inversion input terminal of an operational amplifier 26. The output signal of the operational amplifier 26 is provided to a gate of a correction transistor Q2, which is an N-channel MOS transistor. The output signal of the operational amplifier 26 is also output from the output terminal of the first peak hold circuit 20a to the first sample hold circuit 80a as the output signal Vout (peak voltage Vp). The correction transistor Q2 has substantially the same element size as the input transistor Q1. The source of the correction transistor Q2 is coupled to the inversion input terminal of the operational amplifier 26. The feedback loop formed by the correction transistor Q2 and the operational amplifier 26 functions as a correction circuit 25 for correcting the hold voltage of the capacitor C1 to substantially the same potential as the peak value of the input signal Vin.

The current mirror circuit 31 coupled to the input transistor Q1 is configured by P-channel MOS transistors Q3 and Q4. The drain of the transistor Q3 is coupled to the drain of the input transistor Q1. The sources of the two transistors Q3 and Q4 are coupled to the high potential power supply VDD. The drain of the transistor Q3 is coupled to the gates of the transistors Q3 and Q4, and the drain of the transistor Q4 is coupled to a current-voltage conversion circuit 36. The transistors Q3 and Q4 have substantially the same element size so as to generate a flow of substantially the same drain current. In this case, the transistor Q4 generates a flow of the drain current having the same current value as the current I1 flowing to the input transistor Q1. The current mirror circuit 31 configures the current detection circuit 30.

The current-voltage conversion circuit 36 is configured by N-channel MOS transistors Q5 and Q6, which are coupled in series. The drain of the transistor Q4 is coupled to the drain and gate of the transistor Q5. The source of the transistor Q5 is coupled to the drain and gate of the transistor Q6, and the source of the transistor Q6 is coupled to ground. Furthermore, a node N3 between the transistor Q4 and the transistor Q5 is coupled to a gate of an N-channel MOS transistor Q7. The gate of the transistor Q7 is supplied with the voltage V1 corresponding to the drain current (current I1) of the transistor Q4. In other words, the drain current of the transistor Q4 undergoes current-voltage conversion in the transistors Q5 and Q6, and the converted voltage V1 is supplied to the gate of the transistor Q7.

The drain of the transistor Q7 is coupled to the high potential power supply VDD, and the source is coupled to ground via a capacitor C2 serving as a peak current hold capacitor. A current source 37 is coupled in parallel to the capacitor C2. The droop current Id2 of the current source 37 is set to have substantially the same current value as the droop current Id1 of the current source 21. A node N4 between the transistor Q7 and the capacitor C2 is coupled to the gate of a transistor Q8, which is an N-channel MOS transistor. The gate of the transistor Q8 is supplied with the hold voltage held in the capacitor C2. In this case, the capacitor C2 holds the peak value of the drain current of the transistor Q4, that is, the voltage corresponding to the current I1 (peak current) during peak detection. In other words, the capacitor C2 holds the voltage that is substantially the same as the source voltage of the transistor Q5 (gate voltage of the transistor Q6) of when the peak current is flowing. Specifically, the capacitor C2 is charged to a potential that is lower than the peak value (voltage V1 when peak current is flowing to the transistor Q4) of the voltage V1 supplied from the current-voltage conversion circuit 36 by an amount corresponding to the gate-source voltage of the transistor Q7. The transistors Q5 and Q7 have substantially the same element size, and the same voltage V1 is supplied to their gates. Thus, the capacitor C2 is charged to substantially the same potential as the source voltage of the transistor Q5 when the peak current is flowing to the transistor Q4. The transistor Q7, the capacitor C2, and the current source 37 configure the hold circuit.

The hold voltage of the capacitor C2 is supplied to the transistor Q8. The source of the transistor Q8 is coupled to ground, and the drain is coupled to the source of the correction transistor Q2. The transistor Q8 has substantially the same element size as the transistor Q6. The source-grounded type transistor Q8 converts the hold voltage of the capacitor C2 to a current Ip, which corresponds to the peak current, and supplies the current Ip to the correction transistor Q2. Specifically, the gate voltage of the transistor Q8 is substantially equal to the gate voltage of the transistor Q6 when the peak current is flowing, and the source voltage of the transistor Q8 is substantially equal to the source voltage of the transistor Q6. Thus, when the peak current is flowing (during peak detection), the transistors Q6 and Q8 operate in substantially the same manner as a current mirror. Therefore, the transistor Q8 generates a flow of a drain current (current Ip) having substantially the same current value as the peak current flowing to the transistor Q6.

In one example, in the first embodiment, the transistors Q5 to Q8, the capacitor C2, and the current source 37 configure the peak current hold circuit 35.

The drain of the correction transistor Q2, which is supplied with the current Ip from the peak current hold circuit 35, is coupled to the high potential power supply VDD via a transistor Q9, which is a P-channel MOS transistor. The drain and the gate of the transistor Q9 are coupled to the drain of the correction transistor Q2, and the source of the transistor Q9 is coupled to the high potential power supply VDD. The transistor Q9 has substantially the same element size as the transistor Q3, which is coupled to the drain of the input transistor Q1. Therefore, the drain voltage of the input transistor Q1 and the drain voltage of the correction transistor Q2 are substantially the same.

The second peak hold circuit 20b for holding the minimum value of the input signal Vin may be configured by substituting the N-channel MOS transistor shown in FIG. 7 to the P-channel MOS transistor and the P-channel MOS transistor to the N-channel MOS transistor, and reversing the directions of the power supply and the current. Such a configuration will not be described.

The operation of the first peak hold circuit 20a will now be discussed centering on the operation of the current detection circuit 30 and the peak current hold circuit 35.

First, if the input signal Vin is constant, the potential difference of the input signal Vin and the hold voltage of the capacitor C1 corresponds to the gate-source voltage of the input transistor Q1, and the droop current Id1 of the current source 21 flows to the input transistor Q1 by the gate-source voltage. Thus, only the droop current Id1 of the current source 21 flows to the input transistor Q1 as the current I1, and the charging current Ic1 does not flow to the capacitor C1. The current I1 also flows to the transistors Q3 to Q6 due to the current mirror operation by the transistors Q3 and Q4. In this case, only the droop current Id2 (Id1) of the current source 37 flows to the transistor Q7 in the peak current hold circuit 35 as the current I2. Therefore, the gate voltage and the source voltage of the transistors Q6 and Q8 become substantially equal. Thus, the drain currents of the transistors Q6 and Q8 also become substantially equal. The drain current of the transistor Q6 is substantially equal to the current I1 flowing to the input transistor Q1. Thus, the current Ip, the current value of which is equal to the current I1 flowing to the input transistor Q1, also flows to the correction transistor Q2. This matches the bias conditions of the input transistor Q1 and the correction transistor Q2 in a normal state.

Next, during peak detection for detecting the peak value when the input signal Vin rises, the input transistor Q1 is activated when the input signal Vin becomes higher than the voltage obtained by adding the gate-source voltage (voltage capable of flowing the droop current Id1) of the input transistor Q1 to the hold voltage of the capacitor C1. The charging current Ic1 then flows to the capacitor C1 and charges the capacitor C1. The current I1 (Ic1+Id1) in which the charging current Ic1 and the droop current Id1 are added flows to the input transistor Q1. When the input signal Vin reaches the peak value (during peak detection), the charging current Ic1 becomes the peak value and the current I1 becomes the peak value (peak current). The current I1 also flows to the transistors Q3 to Q6 due to the current mirror operation performed by the transistors Q3 and Q4. The transistor Q7 is then activated by the voltage V1 corresponding to the current I1 (drain current of transistor Q4). The charging current Ic2 then flows to the capacitor C2, and the capacitor C2 is charged by the charging current Ic2. As a result, the hold voltage of the capacitor C2 is held at the gate voltage of the transistor Q6 when the peak current is flowing to the transistor Q5. In this case, the gate and source voltages of the transistors Q6 and Q8 are substantially equal, and the transistors Q6 and Q8 operate in substantially the same manner as a current mirror. Therefore, the drain currents of the transistors Q6 and Q8 become substantially equal. In other words, the current Ip, the current value of which is substantially equal to the peak value (peak current) of the current I1 flowing to the input transistor Q1, flows to the correction transistor Q2. The bias condition of the correction transistor Q2 is thus the same as the bias condition during peak detection of the input transistor Q1. Thus, the gate-source voltage of the correction transistor Q2 is substantially matched with that of the input transistor Q1 during peak detection. Accordingly, the level of the hold voltage of the capacitor C1 shifted from the input signal Vin is accurately corrected by the feedback loop formed by the correction transistor Q2 and the operational amplifier 26. This improves the correction accuracy.

When the input signal Vin decreases and the potential difference between the input signal Vin and the hold voltage of the capacitor C1 becomes lower than a threshold value voltage of the input transistor Q1 in the hold period after detecting the peak value of the input signal Vin, the charging of the capacitor C1 is stopped. This holds the hold voltage of the capacitor C1, and the hold voltage is supplied to the correction circuit 25. In such a case, the charging current Ic1 does not flow to the capacitor C1. Thus, only the droop current Id1 of the current source 21 flows to the input transistor Q1 as the current I1. The current I1 also flows to the transistors Q3 to Q6 due to the current mirror operation performed by the transistors Q3 and Q4.

In this state, the current Ip held in the peak current hold circuit 35 is supplied to the correction transistor Q2. Specifically, the hold voltage of the capacitor C2 is held at the gate voltage of the transistor Q6 during peak detection. As a result, the gate voltages of the transistors Q6 and Q8 are substantially equal, and the source voltages of the transistors Q6 and Q8 are also substantially equal. Thus, in the hold period, the current Ip, which is substantially equal to the current I1 (peak current) flowing to the input transistor Q1 during peak detection, is supplied to the correction transistor Q2. Accordingly, the bias condition of the correction transistor Q2 is the same as the bias condition of the input transistor Q1 during peak detection. Thus, the gate-source voltage of the correction transistor Q2 is substantially the same as the gate-source voltage of the input transistor Q1 when the hold voltage of the capacitor C1 is held. The correction accuracy of the correction circuit 25 is thus improved even in the hold period, in which the hold voltage of the capacitor C1 is continuously corrected.

In this manner, the peak current is held by the peak current hold circuit 35 and supplied to the correction transistor Q2. Accordingly, the gate-source voltage of the correction transistor Q2 is substantially equal to that of the input transistor Q1 not only during peak detection but also during the hold period. As a result, the hold voltage of the capacitor C1 corrected to have substantially the same potential as the peak value of the input signal Vin is output and held as the output signal Vout (peak voltage Vp). This improves the correction accuracy of the correction circuit 25. As the accuracy of peak detection by the peak hold circuit, which is applicable for high-speed operations, improves, the peak value of the differential signal from the differential output amplifier 13 may be detected with high accuracy even if such a differential signal is a high-speed signal. As a result, the high accuracy for APC is maintained even in high-speed operations.

The peak hold circuit of the first embodiment has the advantages described below.

(1) The peak current hold circuit 35 holds the peak value of the current (current I1 flowing to the input transistor Q1) detected by the current detection circuit 30 and supplies the held current Ip to the correction transistor Q2. Thus, the bias condition of the correction transistor Q2 is substantially the same as the bias condition during peak detection of the input transistor Q1 not only during peak detection but also during the hold period after the peak detection. In other words, the gate-source voltage of the correction transistor Q2 is substantially the same as that of the input transistor Q1. Therefore, the level of the hold voltage of the capacitor C1 shifted from the input signal Vin is more accurately corrected by the feedback loop formed by the correction transistor Q2 and the operational amplifier 26. This enhances the correction accuracy of the correction circuit 25. As a result, the peak detection accuracy of the peak hold circuit 20a, which is applicable for high-speed operations, is improved.

Furthermore, due to the improvement in the correction accuracy of the correction circuit 25, the gate voltage (input signal Vin) of the input transistor Q1 becomes substantially equal to the gate voltage (output voltage Vout) of the correction transistor Q2. Thus, the influence of body effect is subtle.

(2) The transistor Q9, which has substantially the same element size as the transistor Q3, is arranged between the correction transistor Q2 and the high potential power supply VDD. Thus, the drain voltage of the correction transistor Q2 has substantially the same potential as the drain voltage of the input transistor Q1. Accordingly, the bias condition of the correction transistor Q2 further approaches the bias condition of the input transistor Q1. This further improves the correction accuracy of the correction circuit 25.

Second Embodiment

A second embodiment of a peak hold circuit 20a will now be discussed with reference to FIGS. 8 and 9. Like or same reference numerals are given to those components that are the same as the corresponding components shown in FIGS. 3 to 7. Such components will not be described in detail. The description will center on differences from the first embodiment.

Figure 8:
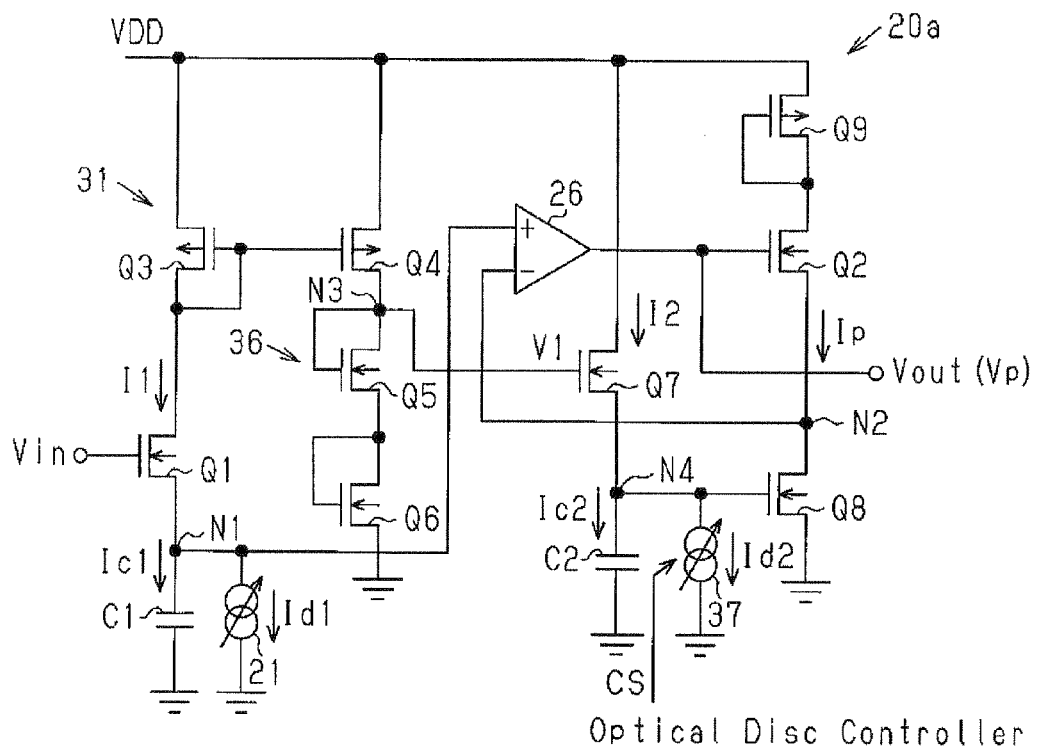
FIG. 8 is a schematic circuit diagram of a peak hold circuit of a second embodiment.

As shown in FIG. 8, in the peak hold circuit 20a of the second embodiment, the optical disc controller 90 provides the control signal CS (see broken line of FIG. 3) to the current source 37 of the peak current hold circuit 35. The current source 37 changes the current value of the droop current Id2 in accordance with the control signal CS. Specifically, the control signal CS having an H level is input to the current source 37 when the potential difference between the input signal Vin and the hold voltage of the capacitor C1 suddenly increase, that is, when the hold voltage of the capacitor C1 suddenly changes (e.g., initial rising period of the input signal Vin). The current source 37 increases the droop current Id2 to be greater than the droop current Id1 in accordance with the control signal CS having an H level. The current source 37 sets the droop current Id2 to be equal to the droop current Id1 in accordance with the control signal CS having an L level. Since the optical disc controller 90 controls the output timing of the light emission pulse signal PS, the optical disc controller 90 provides the control signal CS having an H level to the current source 37 when the input signal Vin initially rises. The timing the control signal CS is output from the optical disc controller 90 may be set in advance in the firmware.

The operation of the current source 37 of the peak hold circuit 20a of the second embodiment will now be discussed.

Figure 9:
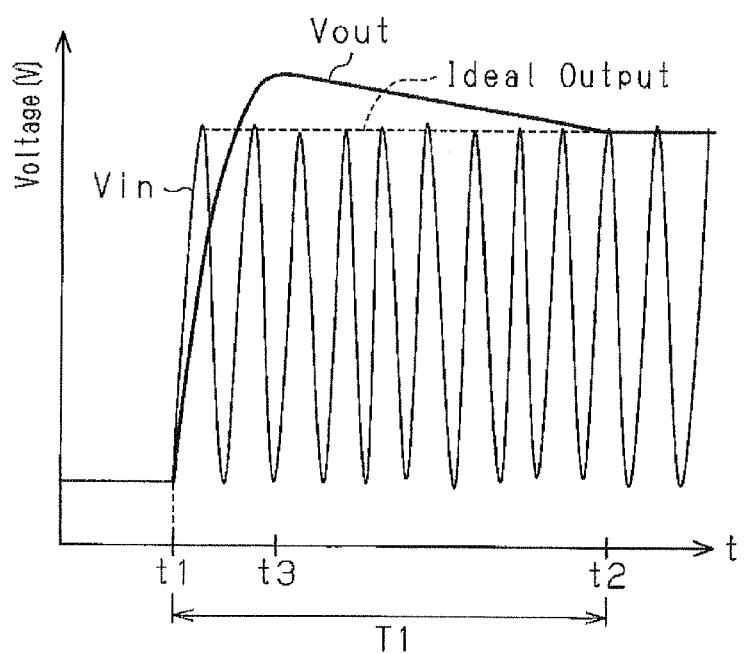
FIG. 9 is a schematic waveform chart showing the operation of the peak hold circuit of FIG. 8.

As shown in FIG. 9, change in the voltage of the input signal Vin is large when the input signal Vin first rises (during the initial peak value detection). The potential difference between the input signal Vin and the hold voltage of the capacitor C1 is thus large. The input transistor Q1 is then completely activated before the input signal Vin reaches the peak value, and a large charging current Ic1 momentarily flows. That is, the charging current Ic1 overshoots. In such a case, the peak current hold circuit 35 holds the current I1 in which the charging current Ic1 and the droop current Id1 are added. When the potential difference between the hold voltage of the capacitor C1 and the peak value of the input signal Vin becomes small and decreases to a value close to the threshold value voltage of the input transistor after the rising of the signal, the output shifts to the normal state, and the charging current Ic1 becomes small as shown in FIG. 5B. However, the peak current hold circuit 35 holds the overshoot current I1 as the current Ip. The held current Ip is larger than the peak value (normal value) of the current I1 flowing to the input transistor Q1 during peak detection in the normal state. Thus, the error between the gate-source voltage of the input transistor Q1 and the gate-source voltage of the correction transistor Q2 becomes large. As a result, the output signal Vout also overshoots when the current Ip overshoots, as shown in FIG. 9, and the correction accuracy of the correction circuit decreases. The held current Ip gradually returns to the normal value in accordance with the droop current Id2. However, much time is necessary to return to the normal value if the current value of the droop current Id2 is small. This lengthens the period T1 in which an error is output.

In the second embodiment, the optical disc controller 90 outputs the control signal CS having an H level to the current source 37 when the hold voltage of the capacitor C1 suddenly changes, specifically, at the timing (t1) the input signal Vin initially rises. The current source 37 sets the current value of the droop current Id2 to be larger than the droop current Id1 in accordance with the control signal CS having an H level. The increased droop current Id2 reduces the time (period T1 of FIG. 9) for the current Ip held in the peak current hold circuit 35 to return to the normal value. The output signal Vout becomes substantially the same potential as the ideal output (peak value of the input signal Vin) as shown in FIG. 9 when the current Ip returns to the normal value.

The optical disc controller 90 outputs the control signal CS having an L level to the current source 37 after a given time elapses from when the control signal CS having an H level is output such as at a timing at which the current Ip returns to the normal value (time t2). The current source 37 sets the droop current Id2 to be equal to the current value of the droop current Id1 in accordance with the control signal CS having an L level. The droop current Id2 becomes equal to the droop current Id1 after the current Ip returns to the normal value. Therefore, the droop rate at the hold voltage of the capacitor C2 is prevented from becoming unnecessarily large.

The second embodiment has following advantage described below in addition to advantages (1) and (2) of the first embodiment.

(3) The droop current Id2 is increased at a timing the input signal Vin initially rises. The increased droop current Id2 rapidly returns the current Ip, which overshoots, to the normal value. This shortens the time required to return the current Ip to the normal value (period in which error is output). Furthermore, the wait time of the system (the period from the when the input signal Vin initially rises to when the current Ip returns to the normal value) may be shortened.

Third Embodiment

A peak hold circuit 20a of a fourth embodiment will now be discussed with reference to FIG. 10. Like or same reference numerals are given to those components that are the same as the corresponding components shown in FIGS. 3 to 9. Such components will not be described in detail. The description will center on differences from the first embodiment.

Figure 10:
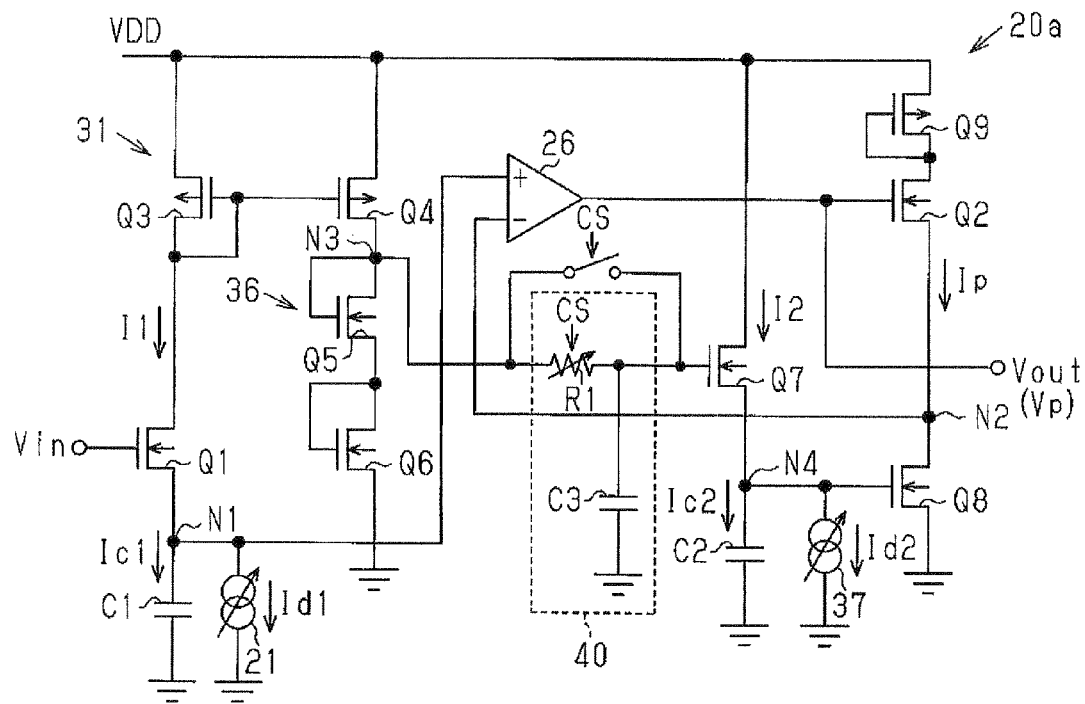
FIG. 10 is a schematic circuit diagram of a peak hold circuit of a third embodiment.

As shown in FIG. 10, the peak hold circuit 20a of the third embodiment further has a lowpass filter 40 including a variable resistance R1 and a capacitor C3 between the drain (node N3) of the transistor Q5 of the current-voltage conversion circuit 36 and the gate of the transistor Q7 of the hold circuit. As described above, the charging current Ic1 may overshoot when the input signal Vin initially rises. The lowpass filter 40 absorbs the rapid rising change in the voltage V1 of the node N3 caused by the overshooting of the charging current Ic1. Thus, the charging current Ic2 flowing to the capacitor C2 becomes lower than the overshooting charging current Ic1. This reduces the error between the current Ip held in the peak current hold circuit 35 and the normal value. Accordingly, the correction accuracy of the correction circuit 25 during the initial rising is prevented from being decreased, and the time required to return the current Ip to the normal value is shortened.

In a normal state in which change in the hold voltage of the capacitor C1 is small, a configuration for reducing the influence of the operation of the lowpass filter 40 may be employed. For example, the resistance value of the variable resistance R1 may be varied in accordance with the control signal CS from the optical disc controller 90. In this case, the cutoff frequency of the lowpass filter 40 may be set to be low with the variable resistance R1 only during the initial rising period (transition period for shifting to the normal state). Alternatively, a switch may be coupled in parallel to the lowpass filter 40, as shown in FIG. 10. In this case, the lowpass filter 40 may be bypassed by activating the switch with the control signal CS from the optical disc controller 90 after shifting to the normal state.

Fourth Embodiment

A peak hold circuit 20a of a fourth embodiment will now be discussed with reference to FIG. 11. Like or same reference numerals are given to those components that are the same as the corresponding components shown in FIGS. 3 to 10. Such components will not be described in detail. The description will center on differences from the first embodiment.

Figure 11:
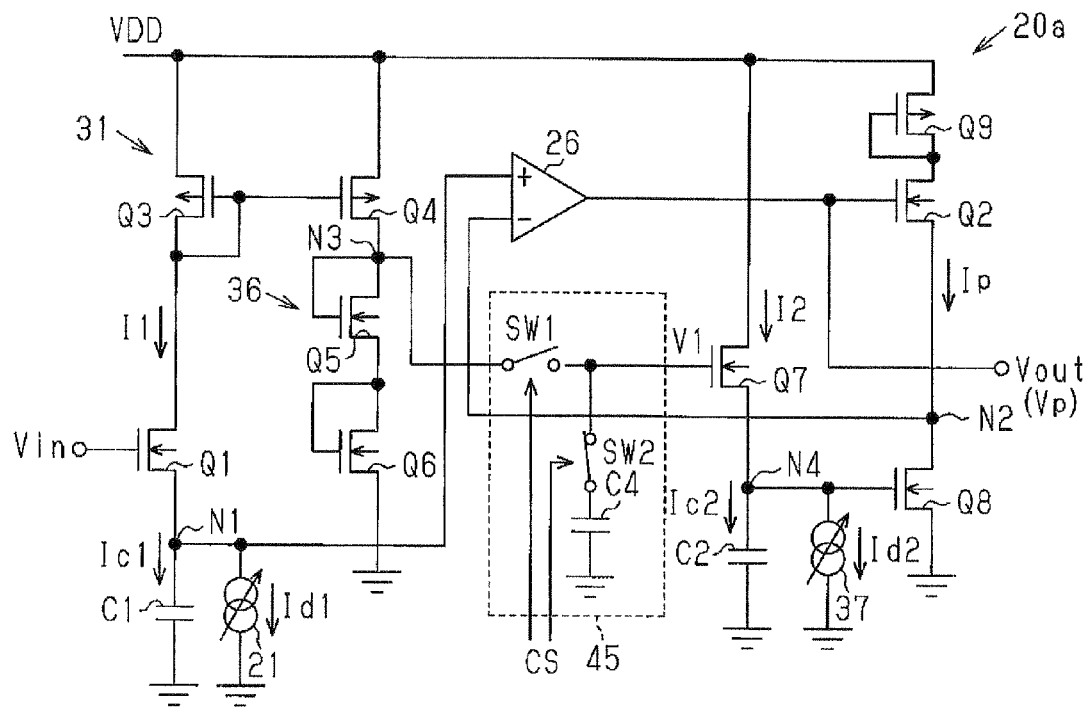
FIG. 11 is a schematic circuit diagram of a peak hold circuit of a fourth embodiment.

As shown in FIG. 11, the peak hold circuit 20a of the fourth embodiment further includes a sample hold circuit 45 between the drain (node N3) of the transistor Q5 of the current-voltage conversion circuit 36 and the gate of the transistor Q7 of the hold circuit. The sample hold circuit 45 includes a first switch SW1, a second switch SW2, and a capacitor C4. A first terminal of the first switch SW1 is coupled to the node N3. The second switch SW2 and the capacitor C4 are coupled in series between the second terminal of the first switch SW1 and ground. The activation and inactivation of the first and second switches SW1 and SW2 are controlled in accordance with the control signal CS from the optical disc controller 90.

The operation of the sample hold circuit 45 will now be discussed.

The first and second switches SW1 and SW2 are both activated by the control signal CS from the optical disc controller 90 before the input signal Vin initially rises (before time t1 in FIG. 9). This charges the capacitor C4 with the voltage corresponding to the current I1 (Id1) flowing to the input transistor Q1 when the input signal Vin is constant and holds the sample hold voltage.

Then, the first switch SW1 is inactivated and the second switch SW2 is activated by the control signal CS when the hold voltage of the capacitor C1 suddenly changes such as at the timing the input signal Vin initially rises (time t1 of FIG. 9). This uncouples the hold circuit from the current-voltage conversion circuit 36 during the first rise in which there is a possibility of the charging current Ic1 overshooting. Therefore, the voltage V1 corresponding to the current I1 detected in the current detection circuit 30 during the initial rising is not supplied to the transistor Q7. This prevents overshoot current from being held in the peak current hold circuit 35. In this case, the current I2 (Id2) flows to the transistor Q7, and the current Ip, which is substantially equal to the droop current Id2, also flows to the correction transistor Q2.

At the normal state transition timing when change in the hold voltage of the capacitor C1 becomes small (e.g., time t3 in FIG. 9), the first switch SW1 is activated and the second switch SW2 is inactivated by the control signal CS. The voltage V1 of the node N3 is then supplied to the gate of the transistor Q7. Thus, the peak value (normal value) of the current I1 flowing to the input transistor Q1 during peak detection in the normal state is held by the peak current hold circuit 35. Accordingly, the current Ip held in the peak current hold circuit 35 is rapidly returned to the normal value after shifting to the normal state.

Furthermore, since the second switch SW2 is inactivated at the normal state transition timing, the capacitor C4 is uncoupled from the gate of the transistor Q7. This improves the response characteristics of the voltage V1 supplied to the gate of the transistor Q7 from the node N3. In other words, when the potential at the node N3 changes as the current I1 changes, the voltage V1 corresponding to such change is rapidly supplied to the gate of the transistor Q7. Accordingly, the voltage corresponding to the peak current is rapidly held by the capacitor C2 in accordance with the change in the potential (voltage V1) of the node N3. This holds the peak current in the peak current hold circuit 35 with satisfactory accuracy.

The fourth embodiment has the following advantage in addition to advantages (1) and (2) of the first embodiment.

(4) The first switch SW1 is inactivated and the second switch SW2 is activated at the timing in which the input signal Vin initially rises. This prevents the voltage V1 corresponding to the overshoot current I1 from being supplied to the transistor Q7. Thus, overshooting of the current Ip held in the peak current hold circuit 35 is prevented.

The first switch SW1 is activated and the second switch SW2 is inactivated at the normal state transition timing. Thus, the peak current hold circuit 35 rapidly holds the peak current of normal value as the current Ip after shifting to the normal state. Accordingly, the period from when the input signal Vin rises to when the current Ip becomes a normal value (wait time of the system) is the same as the time from when the input signal Vin rises to when shifting to the normal state. This drastically shortens the wait time of the system.

Fifth Embodiment

A peak hold circuit 20a of a fifth embodiment will now be discussed with reference to FIGS. 12 and 13. Like or same reference numerals are given to those components that are the same as the corresponding components shown in FIGS. 3 to 11. Such components will not be described in detail. The description will center on differences from the first embodiment.

Figure 12:
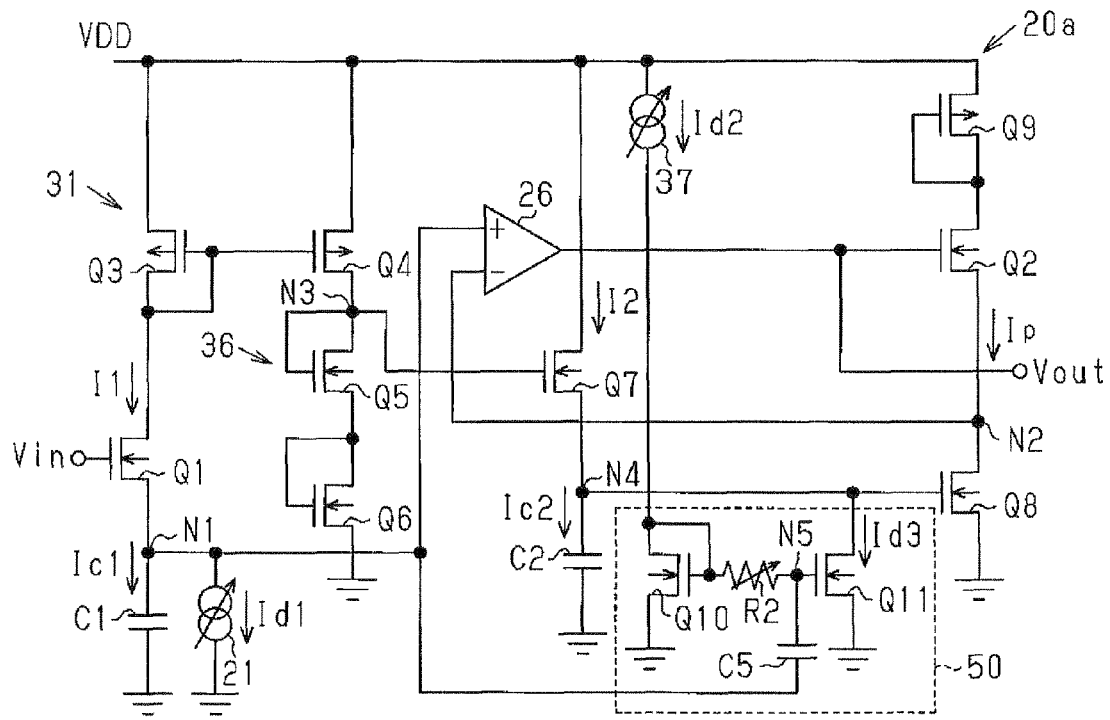
FIG. 12 is a schematic circuit diagram of a peak hold circuit of a fifth embodiment.

As shown in FIG. 12, the peak hold circuit 20a of the fifth embodiment further includes a droop boost circuit 50 for detecting a sudden change in the hold voltage of the capacitor C1 to generate a boost current that is larger than the droop circuit Id2 supplied from the current source 37 in accordance with the voltage change. The droop boost circuit 50 supplies the boost current to the peak current hold circuit 35.

The droop boost circuit 50 includes a transistor Q10, which is an N-channel MOS transistor, the drain of which transistor Q10 is coupled to the current source 37. The current source 37, which is coupled between the power supply VDD and the transistor Q10, supplies the droop current Id2 to the droop boost circuit 50. The droop current Id2 is set to a have a current value equal to, for example, the droop current Id1.

The drain and gate of the transistor Q10 are coupled to each other, and the gate of the transistor Q10 is further coupled to the gate of the transistor Q11, which is an N-channel MOS transistor, via a variable resistance R2. The source of the transistor Q10 is coupled to ground. A node N5 between the variable resistance R2 and the transistor Q11 is coupled to the node N1 via the capacitor C5. The source of the transistor Q11 is coupled to ground, and the drain of the transistor Q11 is coupled to the source (node N4) of the transistor Q7 of the peak current hold circuit 35. The drain current of the transistor Q11 becomes the droop current Id3 (boost current) in the peak current hold circuit 35. The variable resistance R2 and the capacitor C5 configure a differentiation circuit, and the transistors Q10 and Q11 are coupled as a current mirror via the differentiation circuit.

The operation of the droop boost circuit 50 will now be discussed.

Figure 13:
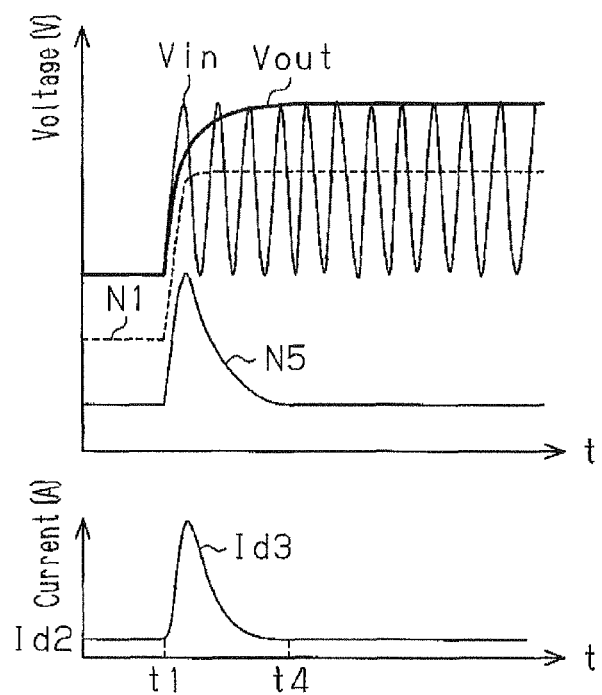
FIG. 13 is a schematic waveform chart showing the operation of the peak hold circuit of FIG. 12.

As shown in FIG. 12, if the potential difference between the hold voltage of the capacitor C1 (holding peak value) and the input signal Vin (new peak value) is large, the source voltage (voltage of the node N1) of the input transistor Q1 rapidly rises in accordance with the change in the peak value (see broken line of FIG. 13). The gate voltage (voltage of the node N5) of the transistor Q1 is increased by the differentiation circuit, which includes the capacitor C5 and the variable resistance R2, by the voltage change at the node Ni (see "N5" of FIG. 13). As the gate voltage of the transistor Q11 increases, the drain current of the transistor Q11, that is, the droop current Id3, is boosted (increased) and becomes larger than the droop current Id2 (see FIG. 13).

When the voltage of the node N1 rapidly rises, an excessively large charging current Ic1 momentarily flows to the capacitor C1, and the charging current Ic1 (current I1 flowing to the input transistor Q1) overshoots. The current I2 flowing to the transistor Q7 also overshoots due to the overshooting of the charging current Ic1. The current I2 flowing to the transistor Q7 is the current obtained by adding the charging current Ic2 flowing to the capacitor C2 and the droop current Id3. When the droop current Id3 is increased to be larger than the droop current Id2 (Id1) as described above, the charging current Ic2 flowing to the capacitor C2 is decreased by an amount corresponding to the increased amount. Therefore, even if the current I2 overshoots, the droop current Id3 increases to become larger than the droop current Id2 when the overshooting occurs. This suppresses the overshooting of the charging current Ic2. The capacitor C2 is charged by the charging current Ic2, and the transistor Q8 converts the hold voltage of the capacitor C2 to the current Ip. Thus, the current Ip is also prevented from overshooting. This prevents the output of the output voltage Vout from becoming larger than the peak value of the actual input signal Vin, as shown in FIG. 13.

After the input signal Vin rises, the droop current Id3 becomes larger than the droop current Id2 for a time period corresponding to a time constant determined by the resistance value of the variable resistance R2 and the capacitance value of the capacitor C5. In the fifth embodiment, the time constant of the differentiation circuit is set such that the droop current Id3 is boosted to be larger than the droop current Id2 during the period from the when the input signal Vin rises (time t1 of FIG. 13) to normal state transition (time t4 of FIG. 13). When the voltage charged in the capacitor C5 is discharged, the droop current Id3 that is substantially equal to the droop current Id2 flows to the transistor Q11 due to the current mirror operation of the transistors Q10 and Q11 in the same manner as prior to the rising.

The fifth embodiment has the advantage described below in addition to advantages (1) and (2) of the first embodiment.

(5) The droop boost circuit 50 detects the sudden voltage change in the voltage of the node N1 in the differentiation circuit and boosts the droop current Id3, which is supplied to the peak current hold circuit 35, so that it becomes larger than the droop current Id1 (i.e., Id2) in accordance with the voltage change. Thus, even if the voltage of the node N1 suddenly changes and the charging current Ic1 overshoots, the droop current Id3 cancels the overshooting of the charging current Ic2. Accordingly, the current Ip held in the peak current hold circuit 35 is prevented from overshooting. Thus, after shifting to the normal state, the peak current hold circuit 35 rapidly holds the peak current that has a normal value as the current Ip. This drastically shortens the period from when the input signal Vin rises to when the current Ip becomes to have the normal value (wait time of the system).

Furthermore, the droop boost circuit 50 boosts the droop circuit Id3 in accordance with a sudden change in the voltage at the node N1 without the need for the control signal CS from an external device (e.g., optical disc controller 90). Accordingly, the control configuration is simplified. Moreover, the versatility of the peak hold circuit 20a is increased since the peak hold circuit 20a is applicable even to a device of which initial rise timing of the input signal Vin is not known.

Sixth Embodiment

A peak hold circuit 20a of a sixth embodiment will now be discussed with reference to FIGS. 14 and 15. Like or same reference numerals are given to those components that are the same as the corresponding components shown in FIGS. 3 to 13. Such components will not be described in detail.

In the peak hold circuit 160 shown in FIG. 2, the accuracy of the peak detection decreases due to the difference in the emitter-base voltages of the input transistor Q31 and the correction transistor Q32. In addition, the accuracy of the peak detection decreases due to the reasons described below.

Figure 14A:
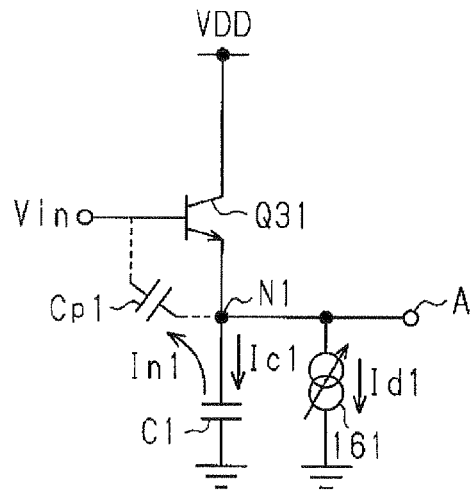
FIGS. 14A to 14C are explanatory diagrams for describing a peak hold circuit of the prior art.
Figure 14B:
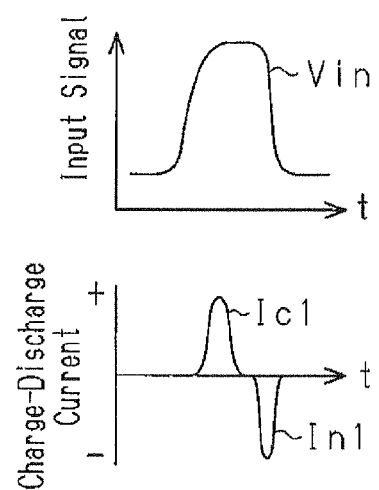
Figure 14C:
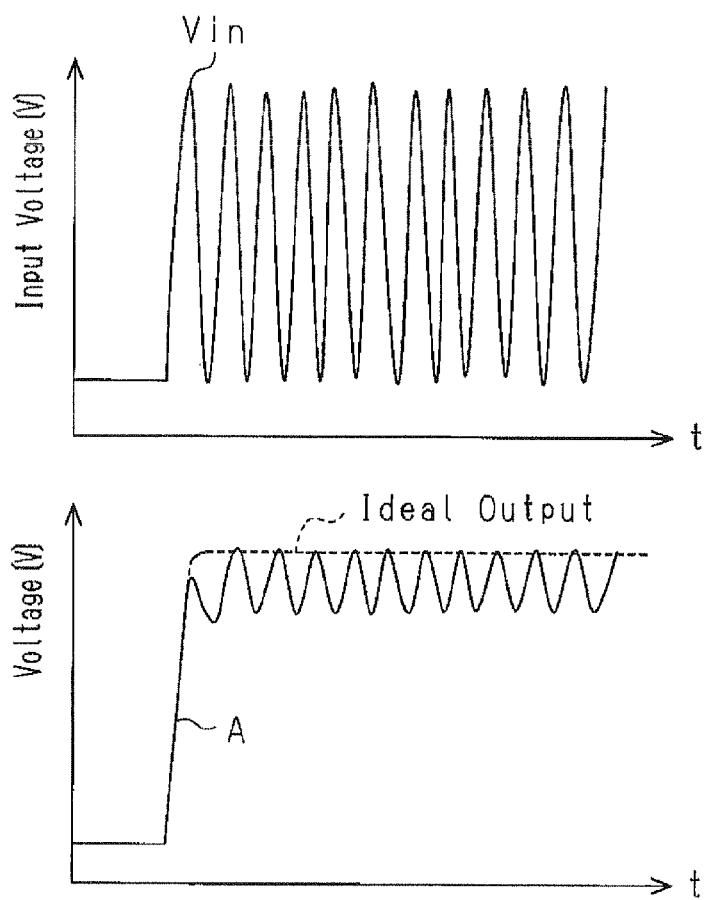

If the input signal Vin is a high speed signal, the signal rises and falls at high speeds. Thus, when the input signal Vin falls, the capacitor C1 is discharged and a discharging current is produced. In other words, as shown in FIGS. 14A and 14B, when the input signal Vin falls, the discharging current In1 flows from the capacitor C1 to a parasitic capacitor Cp1 between the base and the emitter of the input transistor Q31 and discharges the capacitor C1. If the capacitance of the capacitor C1 is small, the discharging evidently affects the hold voltage of the capacitor C1. In other words, the hold voltage of the capacitor Cl is greatly decreased by the discharging of the capacitor C1 through the parasitic capacitor Cp1 when the input signal Vin falls. Thus, when the charging and the discharging of the capacitor C1 are repeated by the charging current Ic1 when the input signal Vin rises and the discharging current In1 when the input signal Vin falls, the output at point A of FIG. 14A repetitively increases and decreases as shown in FIG. 14C. This produces noise components and error components. The output signal Vout is generated based on the output at point A. Thus, the output signal Vout also repetitively increases and decreases in the same manner as the output at point A. This consequently decreases the accuracy of the peak detection.

The influence of the discharge may be reduced if the capacitance of the capacitor C1 is sufficiently larger than the parasitic capacitor. However, if the capacitance of the capacitor C1 is increased, the peak value cannot be rapidly detected when the input signal rises since the charge-up becomes slow. Furthermore, the area efficiency decreases since a large area becomes necessary. Alternatively, if the input transistor Q31 is miniaturized, the parasitic capacitor Cp1 may be reduced thereby reducing the influence of the discharging. However, the charge-up becomes slow and relative variations between elements become large. In this manner, the influence of the discharging and the charge-up speed are in a trade-off relationship, and it is difficult for these two factors to be satisfactory at the same time.

As shown in FIG. 15, the peak hold circuit 20a of the sixth embodiment includes a discharge cancel circuit 60 for canceling the influence of the discharge to reduce the influence of the discharging while improving the charge-up speed and the area efficiency.

In the discharge cancel circuit 60, the input signal Vin input to the input transistor Q1 is provided to an inversion circuit 61. The inversion circuit 61 generates an inverted signal XVin by inverting (−1 times) the input signal Vin and provides the inverted signal XVin to the gate of, for example, an N-channel MOS transistor Q21 serving as a copy transistor.

The internal configuration of the inversion circuit 61 will now be described. The input signal Vin is provided to the gate of the transistor Q22, which is an N-channel MOS transistor. The drain of the transistor Q22 is coupled to the high potential power supply VDD, and the source is coupled to a constant current source 62. The source of the transistor Q22 is coupled to the gate of a transistor Q23, which is an N-channel MOS transistor, via a capacitor C6 for cutting the direct current component. The transistor Q22 and the constant current source 62 configure a source follower circuit.

The resistances R3 and R4, which are coupled in series between the high potential power supply VDD and ground, configure a bias circuit. A node between the resistances R3 and R4 is coupled to the gate of the transistor Q23, and bias voltage is supplied to the transistor Q23.

The source of the transistor Q23 is coupled to ground via a resistance R5, and the drain of the transistor Q23 is coupled to the high potential power supply VDD via a variable resistance R6. Further, the drain of the transistor Q23 is coupled to the gate of the transistor Q21. The transistor Q23, the resistance R5, and the variable resistance R6 configure a source-ground amplification circuit, and the gain of the amplification circuit is adjusted by resistance values of the resistance R5 and the variable resistance R6. The gain of the source-grounded amplification circuit is substantially set to about −1 by setting the resistance values of the resistance R5 and the variable resistance R6 to be the same. Therefore, the input signal Vin input to the source-grounded amplification circuit is inverted (−1 times) and provided to the gate of the transistor Q21 as the inverted signal XVin. The gain of the source-grounded amplification circuit may be finely adjusted by finely adjusting the resistance value of the variable resistance R6.

The drain of the transistor Q21 is coupled to the high potential power supply VDD, and the source is coupled to the node N1 via a capacitor C7, which serves as a copy hold capacitor. The source of the transistor Q21 is coupled to a current source 63 for biasing the transistor Q21. The transistor Q21 has substantially the same element size as the input transistor Q1 so that the parasitic capacitor Cp2 between the gate and the source of the transistor Q21 becomes substantially the same as the parasitic capacitor Cp1 of the input transistor Q1. The capacitor C7 is set to have a capacitance that is larger than the parasitic capacitor Cp2 of the transistor Q21.

In this manner, in the discharge cancel circuit 60, the inverted signal XVin of the input signal Vin (e.g., signal that rises when the input signal Vin falls) is provided to the transistor Q21. Accordingly, the capacitor C7 is charged and discharged through the parasitic capacitor Cp2, which is substantially identical to the parasitic capacitor Cp1 of the input transistor Q1. Specifically, when the discharging current In1 flows from the capacitor C1 to the parasitic capacitor Cp1, the charging current Ic3, which is substantially equal to the discharging current In1, flows to the capacitor C7, and current corresponding to the charging current Ic3 is supplied to the capacitor C1 through the capacitor C7. This compensates for the charges discharged by the discharging current In1 with the current supplied from the discharge cancel circuit 60 (charging current Ic3). Thus, the influence of the discharging current In1 is canceled. When the charging current Ic1 flows to the capacitor C1, the discharging current In2 that is substantially equal to the charging current Ic1 flows to the parasitic capacitor Cp2 from the capacitor C7.

In the normal state, the envelope does not suddenly and drastically change since the potential difference between the hold voltage of the capacitor C1 and the input signal Vin is small. Thus, the transistor Q21 is in the cut-off state or is biased to sub-threshold in accordance with the input signal Vin (inverted signal XVin). As a result, the influence of the discharge cancel circuit 60 is subtle in the normal state.

The peak hold circuit 20a of the sixth embodiment has the advantages described below.

(7) The discharge cancel circuit 60 supplies the capacitor C1 with the charging current Ic3, which is substantially equal to the discharging current In1 flowing from the capacitor C1 to the parasitic capacitor Cp1. This compensates for the charges discharged by the discharging current In1 with the charging current Ic3 and cancels the influence of the discharging current In1. This prevents the hold voltage of the capacitor C1 from drastically increasing and decreasing when charging and discharging the capacitor C1. As a result, the production of noise components and error components in the hold voltage of the capacitor C1 is prevented, and the accuracy of peak detection is improved.

(8) Furthermore, the capacitance of the capacitor C1 is reduced since the influence of discharge by the discharging current In1 is canceled by the discharge cancel circuit 60. Thus, the charge-up speed of the capacitor C1 is increased and the peak hold circuit 20a is applicable to high-speed operations while the influence of the discharging current is reduced and the accuracy of the peak detection is improved. Moreover, the capacitance of the capacitor C1, which requires a large chip area in the prior art, is reduced. Thus, a peak hold circuit that is more compact than that of the prior art and suitable for high-speed operations is realized.

(9) The inversion circuit 61 includes the source-grounded amplification circuit, which has a low gain and which is realized with a simple structure including the transistor Q23, the resistance R5, and the variable resistance R6. This improves the high frequency characteristics of the peak hold circuit 20a and increase the operation speed.

Seventh Embodiment

A peak hold circuit 20a of a seventh embodiment will now be discussed with reference to FIGS. 16 and 17. Like or same reference numerals are given to those components that are the same as the corresponding components shown in FIGS. 3 to 15. Such components will not be described in detail. The description will center on differences from the sixth embodiment.

Figure 16:
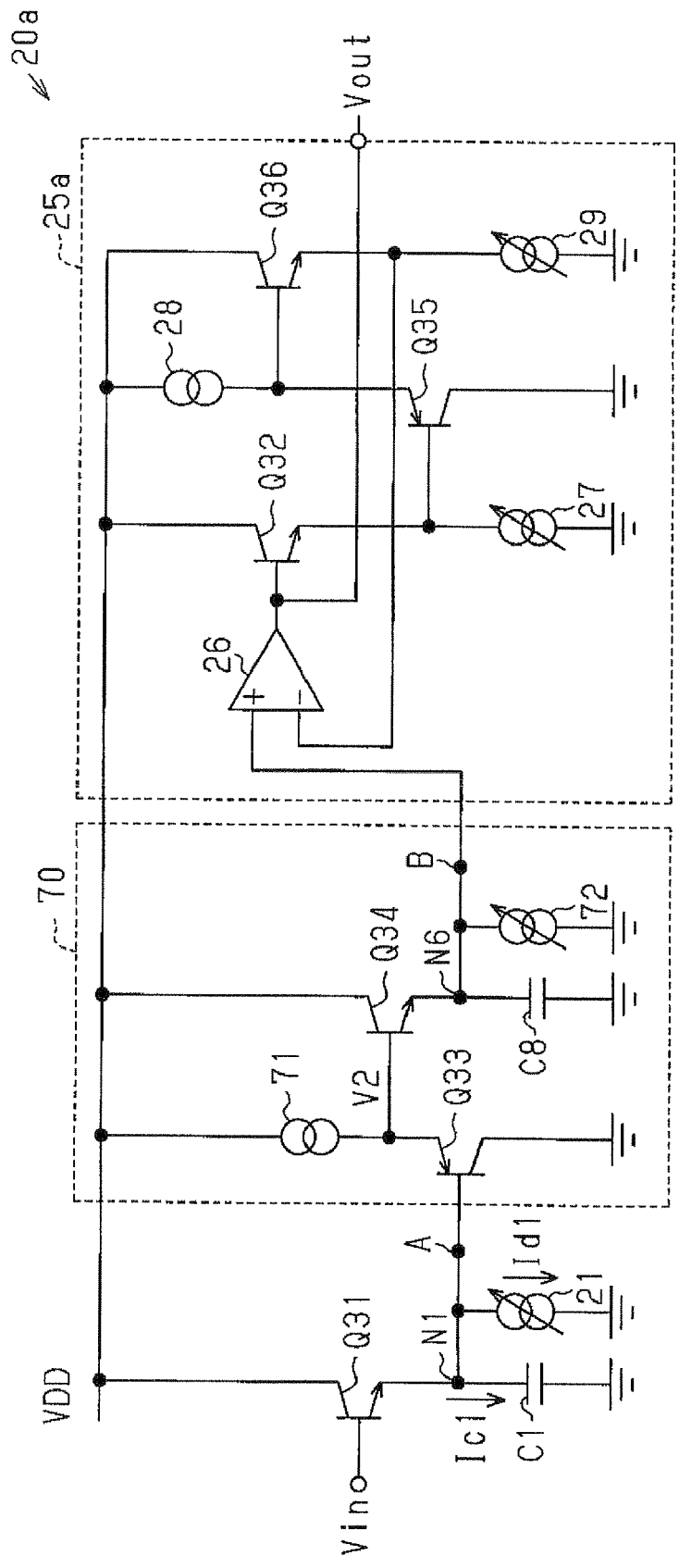
FIG. 16 is a schematic circuit diagram of a peak hold circuit of a seventh embodiment.
Figure 17:
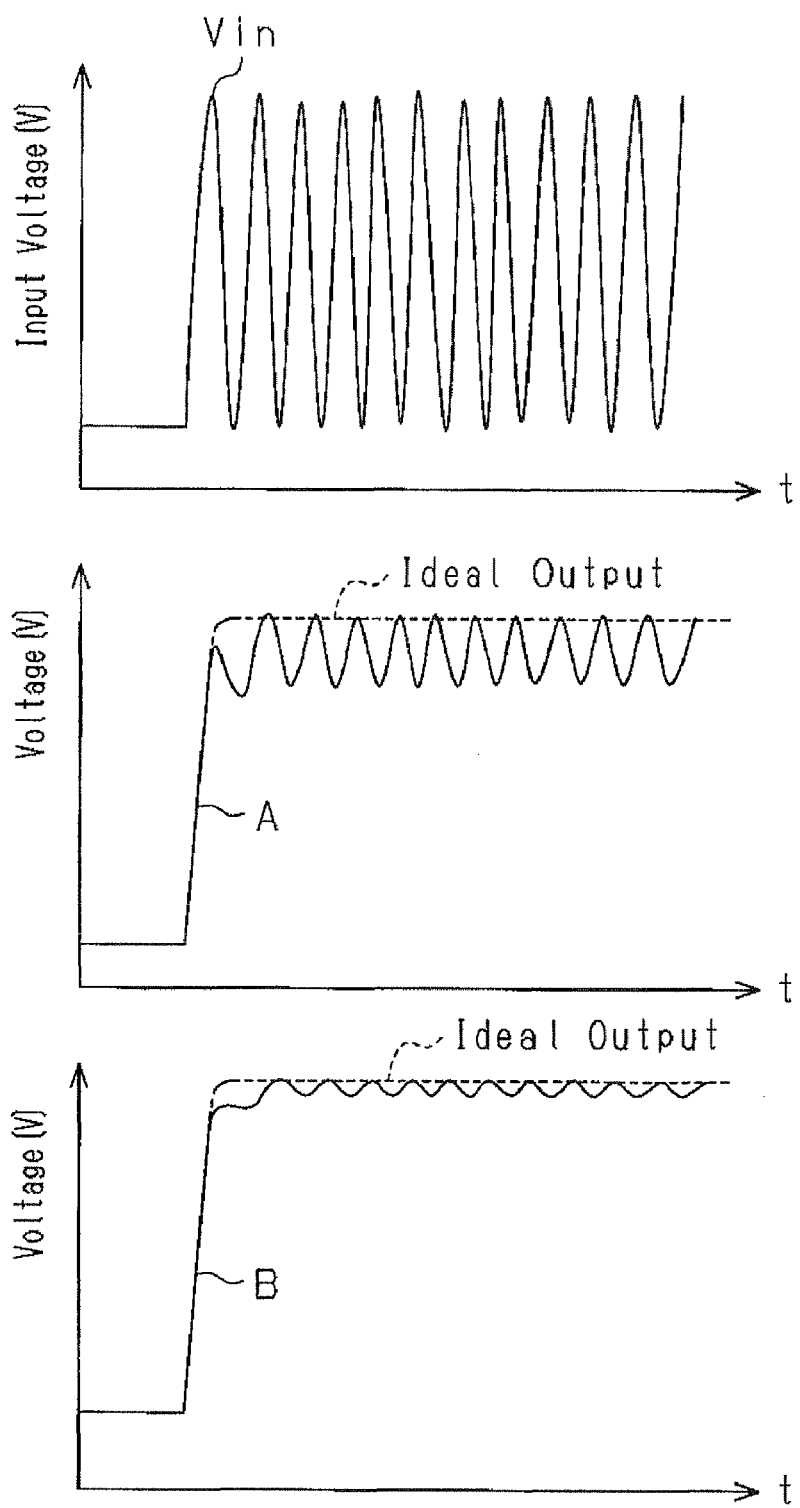
FIG. 17 is a schematic waveform chart showing the operation of the peak hold circuit of FIG. 16.

As shown in FIG. 16, the peak hold circuit 20a of the seventh embodiment includes a first peak hold unit including the input transistor Q31, the capacitor C1, and the current source 21, and a second peak hold unit 70 for holding the peak value of the hold voltage held by the first peak hold unit before the discharging with the discharging current In1.

In the second peak hold unit 70, the hold voltage (voltage at point A: see FIG. 17) held in the capacitor C1 is supplied to the base of a transistor Q33, which is formed, for example, by a PNP transistor. The collector of the transistor Q33 is coupled to ground. The emitter of the transistor Q33 is coupled to a constant current source 71 and the base of the transistor Q34, which is formed, for example, by an NPN transistor. The transistor Q33 and the constant current source 71 configure an emitter follower circuit. The emitter follower circuit has two functions, a buffer function and a level shift function. In other words, the transistor Q33 corrects the level of the input signal Vin shifted by the input transistor Q31 by raising the voltage supplied from the first peak hold unit by an amount corresponding to the base-emitter voltage. This supplies the level shifted voltage V2 (shift voltage) to the base of the transistor Q34 and ensures an input potential tolerable range for the transistor Q34.

The collector of the transistor Q34 is coupled to the high potential power supply VDD, and the emitter is coupled to ground via a capacitor C8. The capacitor C8 is coupled in parallel to a current source 72, which controls the droop rate of the hold voltage of the capacitor C8. A node N6 between the transistor Q34 and the capacitor C8 is coupled to a non-inversion input terminal of the operational amplifier 26 of the correction circuit 25a.

When the voltage V2 is input to the transistor Q34, the capacitor C8 is charged to a potential lower than the voltage V2 by the base-emitter voltage of the transistor Q34. In other words, the capacitor C8 is charged to a potential lower than the peak value of the voltage V2 by the base-emitter voltage of the transistor Q34. When the peak value of the input signal Vin is Vinp, the base-emitter voltage of the input transistor Q31 is Vbe (Q31), the base-emitter voltage of the transistor Q33 is Vbe (Q33), and the base-emitter voltage of the transistor Q34 is Vbe (Q34), the hold voltage Vc of the capacitor C8 may be expressed by the following equation:

Vc=Vinp−Vbe(Q31)+Vbe(Q33)−Vbe(Q34)

In this case, a parasitic capacitor exists in the transistor Q34 in the same manner as the input transistor Q31. However, the signal change in the voltage (see "A" of FIG. 17) supplied to the second peak hold unit 70 is small compared to the signal change in the input signal Vin. Thus, the discharging caused by the parasitic capacitor of the transistor Q34 becomes small, and the decrease in the hold voltage of the capacitor C8 caused by such discharging becomes small. This prevents the hold voltage of the capacitor C8 from drastically increasing and decreasing even if the capacitor C8 repeats the charging and the discharging, and the output (output at point B) of the second peak hold unit 70 is approximated to the ideal output, as shown in FIG. 17.

The correction circuit 25a of the seventh embodiment corrects the amount of level shift produced by both the first peak hold unit and the second peak hold unit 70. In the correction circuit 25a, the output of the operational amplifier 26 is coupled to the base of the transistor Q32, which is, for example, an NPN transistor. The emitter of the transistor Q32 is coupled to a current source 27, and to the base of a transistor Q35, which is, for example, a PNP transistor. The collector of the transistor Q35 is coupled to ground, and the emitter is coupled to a constant current source 28 and to the base of the transistor Q36, which is an NPN transistor. The collector of the transistor Q36 is coupled to the high potential power supply VDD, and the emitter is coupled to a current source 29. A node between the transistor Q36 and the current source 29 is coupled to the inversion input terminal of the operational amplifier 26. The output signal of the operational amplifier 26 is output from the output terminal of the peak hold circuit 20a as the output signal Vout (peak voltage Vp).

In the correction circuit 25a of the seventh embodiment, the difference from the peak value of the input signal Vin caused by the base-emitter voltages of the transistors Q31, Q33, and Q34 is corrected by the base-emitter voltages of the transistors Q32, Q35, and Q36.

The seventh embodiment has the advantages described below in addition to the advantage (8) of the sixth embodiment.

(10) The second peak hold unit 70 holds the peak value of the hold voltage, which is held by the capacitor C1 (first peak hold unit). In this case, the discharging caused by the parasitic capacitor of the transistor Q34 of the second peak hold unit 70 becomes small since the signal change in the hold voltage of the capacitor C1 is smaller than the signal change in the input signal Vin. This prevents the hold voltage of the capacitor C8 from drastically increasing and decreasing even if the capacitor C8 repeats charging and discharging. As a result, the production of noise components and error components at the output (output at point B) of the second peak hold unit 70 is suppressed, and the accuracy of the peak detection is improved.

(11) The hold voltage of the capacitor C1 is supplied to the transistor Q34 through the emitter follower circuit including the transistor Q33 and the constant current source 71. Thus, the shift from the peak value of the input signal Vin caused by the input transistor Q31 is corrected by the base-emitter voltage of the transistor Q33, and the corrected voltage is supplied to the transistor Q34. Therefore, increase of the shift amount from the peak value of the input signal Vin is suitably suppressed by the second peak hold unit 70.

It should be apparent to those skilled in the art that the present invention may be embodied in many other specific forms without departing from the spirit or scope of the invention. Particularly, it should be understood that the present invention may be embodied in the following forms.

The transistor Q9 may be omitted in the first to fifth embodiments.

The second switch SW2 in the sample hold circuit 45 of the fourth embodiment may be omitted.

Figure 18A:
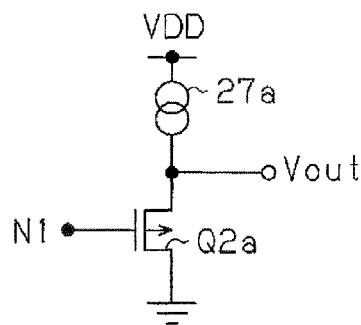
FIGS. 18A and 18B are circuit diagrams showing another example of the correction circuit.

The correction circuit 25 shown in FIG. 15 in the sixth embodiment may be changed to, for example, the correction circuit shown in FIG. 18A. In the correction circuit of FIG. 18A, the gate of a P-channel MOS transistor Q2a having a conductivity type opposite to the input transistor Q1 is coupled to the node N1. The drain of the transistor Q2a is coupled to ground, and the source is coupled to the high potential power supply VDD via a current source 27a. Furthermore, the source is coupled to the output terminal of the peak hold circuit 20a, and the output signal Vout (peak voltage Vp) is output from the output terminal. In this case, the level of the input signal Vin shifted by the input transistor Q1 is corrected by the transistor Q2a.

Figure 18B:
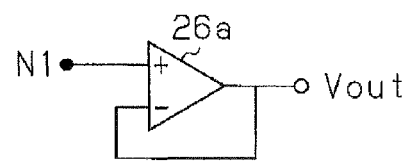

Alternatively, as shown in FIG. 18B, a buffer circuit 26a may be used in place of the correction circuit 25 of FIG. 15, and the voltage of the node N1 may be output as the output signal Vout via the buffer circuit 26a.

In the seventh embodiment, the emitter follower circuit configured by the transistor Q33 and the constant current source 71 may be omitted. In this case, the output (output at point A) of the first peak hold unit is supplied to the base of the transistor Q34. Further, it is preferable that the transistor Q35 and the constant current source 28 of the correction circuit 25a be omitted.

In the first to the sixth embodiments, the N-channel (first conductivity type) MOS transistors and the P-channel (second conductivity type) MOS transistors may respectively be changed to NPN transistors and PNP transistors.

In the seventh embodiment, the NPN transistors and the PNP transistors may respectively be changed to N-channel MOS transistors and P-channel MOS transistors.

One of the first to fifth embodiments may be combined with one of the sixth to seventh embodiments in any manner. For example, the peak hold circuit may include both the current detection circuit 30 and the peak current hold circuit 35 of the first embodiment and the discharge cancel circuit 60 of the sixth embodiment. Further, for example, the peak hold circuit may include both the current detection circuit 30 and the peak current hold circuit 35 of the first embodiment and the second peak hold unit 70 of the seventh embodiment.

In each of the embodiments described above, the peak hold circuits 20a and 20b is applied to an APC circuit. However, the applicable circuit is not particularly limited to such an APC circuit. For example, the peak hold circuits 20a and 20b in each embodiment may be applied to an OPC (Optimum Power Control) circuit 100 in the optical disc device shown in FIG. 19. The OPC circuit 100 is a circuit for searching the laser power at which the optimum asymmetry is obtained by changing the laser power in plural stages and trial writing the test data in the test area (OPC area) of the optical disc. Here, "asymmetry" refers to one of the parameters for evaluating the quality of the recording signal of the optical disc and is a value indicating the deviation amount of the amplitude symmetry of the RF signal.

Figure 19:
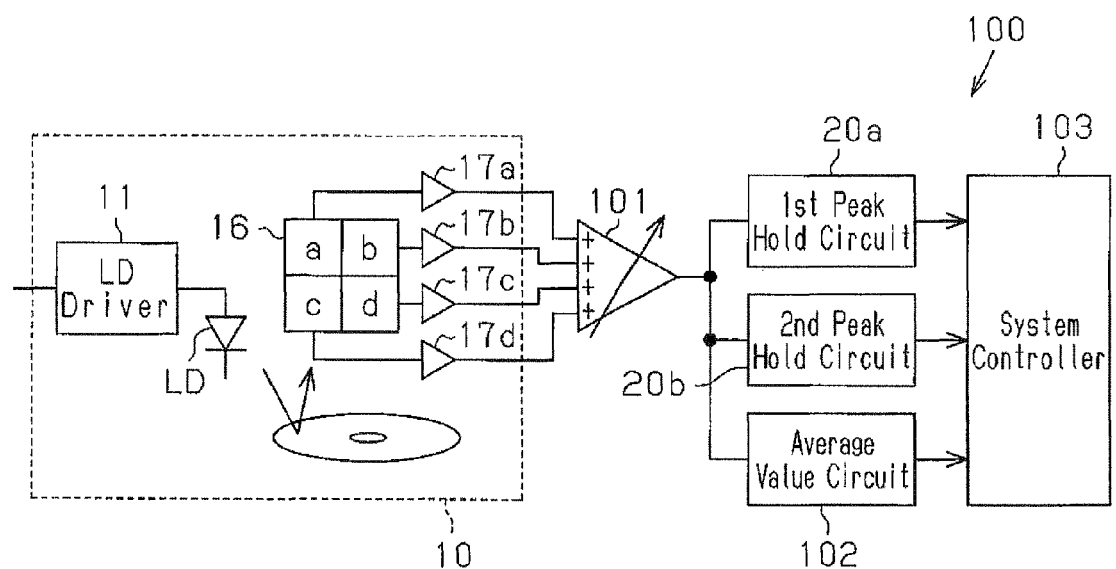
FIG. 19 is a schematic block diagram of an OPC circuit.

In the OPC circuit 100 shown in FIG. 19, a four-part photodetector 16, which is arranged in the optical pickup 10, receives the light reflected from the optical disc. Each divisional photodetector (a, b, c, d) of the four-part photodetector 16 outputs light-receiving current, which corresponds to the amount of received light, to each current voltage converter 17a to 17d. Each current voltage converter 17a to 17d converts the light-receiving current to a light-receiving signal (light-receiving voltage) and outputs the light-receiving signal to an adder 101. The adder 101 generates a sum signal by adding the four light-receiving signals and outputs the sum signal to the first peak hold circuit 20a, the second peak hold circuit 20b, and an average value circuit 102. Here, the received amount of light greatly varies depending on the light irradiation amount of the light source, the reflectivity of the optical disc, and the like. Thus, the gain of the adder 101 is variable.

The first peak hold circuit 20a holds the maximum value (peak value) of the sum signal from the adder 101 and outputs the maximum value to a system controller 103. The second peak hold circuit 20b holds the minimum value (peak value) of the sum signal from the adder 101 and outputs the minimum value to the system controller 103. The average value circuit 102 detects the average value of the sum signal from the adder 101 and outputs the average value to the system controller 103.

The system controller 103 calculates the asymmetry based on the peak values (maximum value and minimum value) and the average value. Further, the system controller 103 sets the laser power that obtains the optimal asymmetry as the laser power for actual data writing (e.g., laser power set as target value TV in the first DAC 83 of FIG. 3).

In this manner, in the OPC circuit 100, the asymmetry is calculated based on the peak values (maximum value and minimum value) detected in the first and second peak hold circuits 20a and 20b. The peak detection accuracy of the first and second peak hold circuits 20a and 20b directly influences the accuracy of the OPC. Accordingly, it is preferable that the peak hold circuits 20a and 20b be used since they are applicable for high-speed operations and have high peak detection accuracies. Thus, the calculation accuracy of the asymmetry and the accuracy of the OPC are maintained at a high level even if the input signal (here, sum signal) is a high-speed signal. Furthermore, the laser power during data writing may be accurately set.

Figure 20:
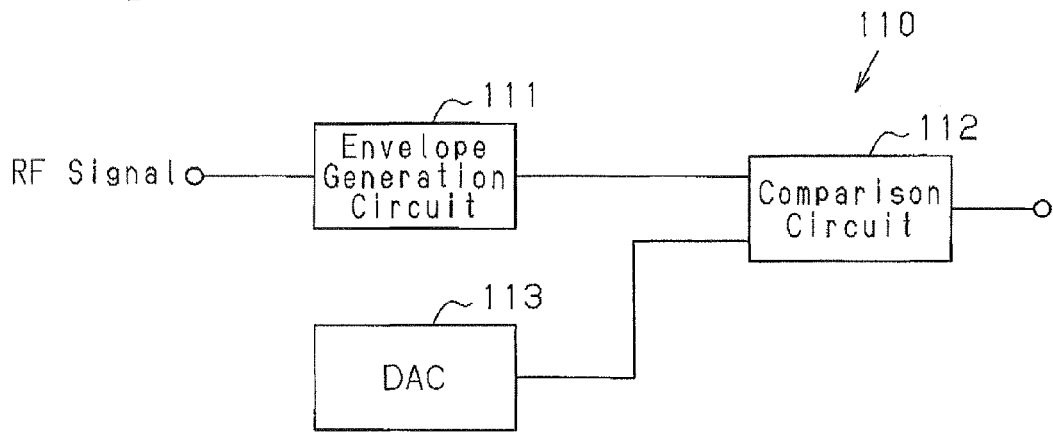
FIG. 20 is a schematic block diagram of a defect detection circuit.

As shown in FIG. 20, the first peak hold circuit 20a or the second peak hold circuit 20b may be applied to an envelope generation circuit 111 of a defect detection circuit 110 arranged in the optical disc device. The defect detection circuit 110 is a circuit for detecting a defect region (region in which dust, fingerprint, and the like are attached to the optical disc surface) of the optical disc based on changes in the reflected light reflected by the optical disc.

In the defect detection circuit 110 shown in FIG. 20, the RF signal, which is generated in accordance with the reflected light from the optical disc, is input to the envelope generation circuit 111. The envelope generation circuit 111 generates an envelope signal, which is in accordance with the maximum value of the RF signal, and outputs the envelope signal to a comparison circuit 112. The droop rate is set to be large in the first peak hold circuit 20a applied to the envelope generation circuit 111. The comparison circuit 112 compares the envelope signal with a given threshold value and outputs a defect detection signal.

In accordance with the defect detection signal of the defect detection circuit 110, servo control for the defect region is fixed to the state before the defect region. Thus, the servo control is performed in a normal manner even in the defect region in which an accurate reflected light cannot be obtained from the optical disc. In this case, the defect region is accurately detected since the envelope signal is accurately generated by the envelope generation circuit 111, which is configured by the first peak hold circuit 20a, even if the RF signal input to the defect detection circuit 110 is a high-speed signal.

Figure 21:
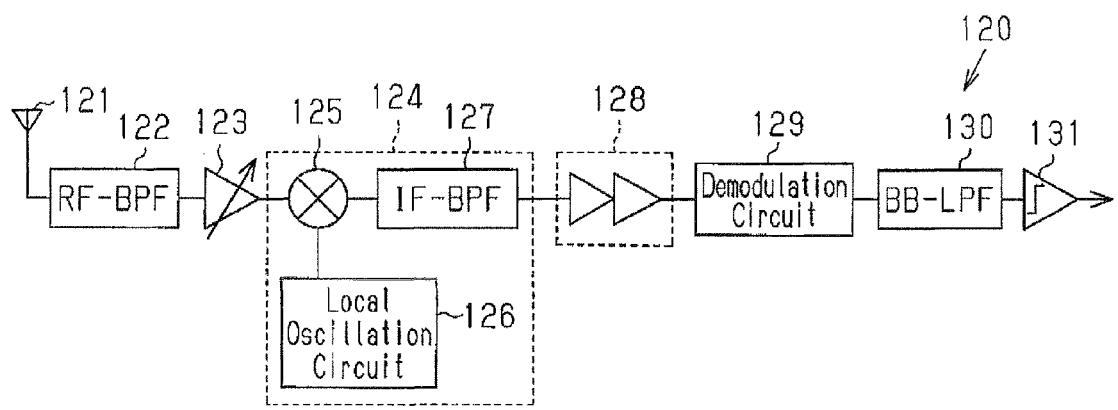
FIG. 21 is a schematic block diagram of a receiver for use in digital data wireless communication.

The first and second peak hold circuits 20a and 20b of the first and fifth to seventh embodiments may be applied to a data slicer circuit 131 arranged in a receiver 120 for digital data wireless communication shown in FIG. 21.

In the receiver 120 shown in FIG. 21, the reception signal received by an antenna 121 is selected to be within a given frequency band by an RF bandpass filter 122, amplified in an RF amplifier 123, and provided to a mixer 215 for a frequency conversion unit 124. The mixer 125 is also provided with a local oscillation signal from a local oscillation circuit 126. The mixer 125 mixes the output signal (RF signal) from the RF amplifier 123 and the local oscillation signal and converts the mixed signal to an intermediate frequency to generate an IF signal. An IF bandpass filter 127 removes unnecessary wave from the IF signal. The IF signal is then amplified to a given level in an IF limiter amplifier 128. The amplified IF signal is demodulated in a demodulation circuit 129 and filtered through a BB lowpass filter 130. The filtering signal is provided to the data slicer circuit 131 as a baseband signal. The data slicer circuit 131 reproduces the transmitted original data based on the baseband signal and generates a digital data stream.

Figure 22:
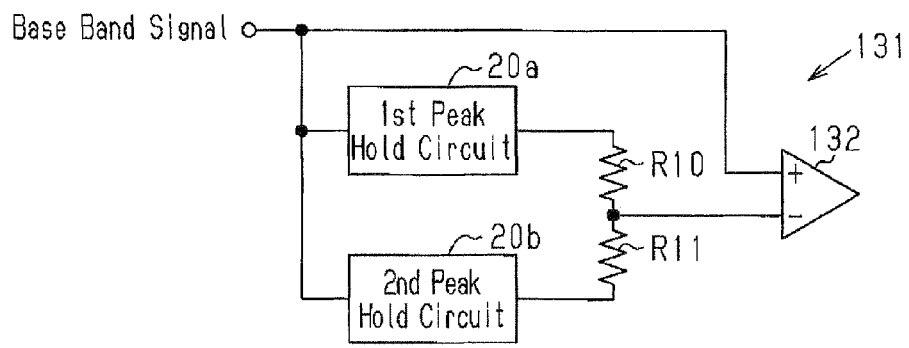
FIG. 22 is a schematic block diagram of a data slicer circuit.

The data slicer circuit 131 is configured, for example, as shown in FIG. 22. In the data slicer circuit 131, the baseband signal from the BB lowpass filter 130 is provided to the first and second peak hold circuits 20a and 20b and the non-inversion input terminal of a comparison circuit 132. The maximum value of the baseband signal detected by the first peak hold circuit 20a and the minimum value of the baseband signal detected by the second peak hold circuit 20b are voltage-divided by resistors R10 and R11, which have the same resistance value and which are coupled in series. The intermediate voltage that is voltage-divided by the resistances R10 and R11 is input to the inversion input terminal of the comparison circuit 132 as a threshold value for binarizing the baseband signal. The comparison circuit 132 compares the baseband signal and the threshold value (intermediate voltage) and outputs binary data (0 or 1) indicating the comparison result as a digital data stream.

For example, digital processing may be performed after AD conversion as the method of binarizing the baseband signal. However, in such a case, an AD converter for converting the baseband signal (analog signal) to the digital signal is required. In particular, when the baseband signal is a high-speed signal, the AD converter needs to be of a flash type. This would enlarge the device and increase power consumption. However, by using the data slicer circuit 131 shown in FIG. 22, the first and second peak hold circuits 20a and 20b detect the peak value with satisfactory accuracy even if the reception signal (baseband signal) is a high-speed signal. Thus, by using the data slicer circuit 131, the high-speed baseband signal, which is an analog signal, may be binarized without using the AD converter. This prevents device enlargement and power consumption increase.

The data slicer circuit 131 may be a circuit for generating a digital data stream by converting into four values an analog signal (baseband signal) demodulated through a four-value FSK modulation scheme or the like. In this case, the level differences of ⅙, ⅜, and ⅚ between the peak level and the bottom level are output as three threshold values.

The data slicer circuit 131 may also be used in data communication other than digital data wireless communication. For example, the data slicer circuit 131 may be used in an infrared signal processing circuit 140 shown in FIG. 23 for data communication of infrared signals.

Figure 23:
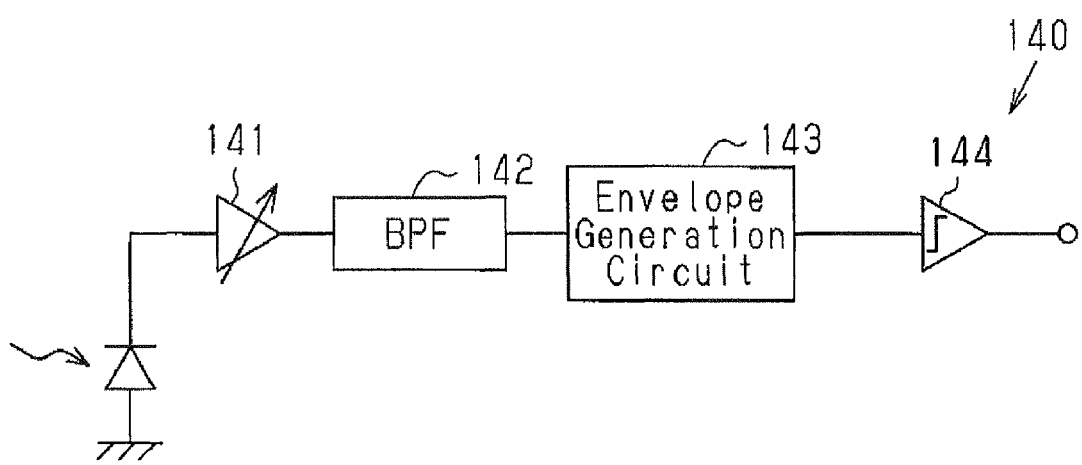
FIG. 23 is a schematic block diagram of an infrared signal processing circuit.

In the infrared signal processing circuit 140 shown in FIG. 23, a photodiode converts the received infrared signal to an electric signal, and an amplifier 141 amplifies the electric signal. A bandpass filter 142 extracts a carrier wave signal that is near a given frequency from the amplified electric signal and outputs the carrier wave signal to the envelope generation circuit 143. The envelope generation circuit 143 generates the envelope signal from the carrier wave signal and outputs the envelope signal to a data slicer circuit 144. The data slicer circuit 144 has substantially the same configuration as the data slicer circuit 131 and generates a control signal or modulation frequency component based on the envelope signal.

The same advantages as the receiver 120 are obtained even if the data slicer circuit 144 is applied to the infrared signal processing circuit 140.

In addition, the peak hold circuits 20a and 20b of the above embodiments are also applicable to signal amplitude detection and signal intensity detection for various types of signals, such as the output signal from a high-speed signal generator or a line receiver input signal. The amplitude signal and the intensity signal detected by the peak hold circuits 20a and 20b is used for gain control, protective circuit operation, and the like.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although embodiments of the present inventions have been described in detail, it should be understood that various changes, substitutions, and alterations could be made hereto without departing from the spirit and scope of the invention.

What is claimed is:

1. A peak hold circuit comprising:
   a peak hold unit including:
   an input transistor which is provided with an input signal; and
   a first hold capacitor which holds a maximum value or a minimum value of the input signal;
   a correction circuit which corrects a hold voltage held in the first hold capacitor, the correction circuit including:
   an operational amplifier which is supplied with the hold voltage; and
   a correction transistor which is provided with an output signal of the operational amplifier and which has a source/emitter coupled to the operational amplifier;
   a current detection circuit which detects a current flowing to the input transistor; and
   a peak current hold circuit which holds a peak value of the current detected by the current detection circuit as a peak current flowing through the input transistor and supplies a current corresponding to the peak current to the source/emitter of the correction transistor.

2. The peak hold circuit according to claim 1, wherein:
   the current detection circuit includes a current mirror circuit coupled to a drain/collector of the input transistor; and
   the peak current hold circuit includes:
   a current-voltage conversion circuit which converts the current supplied from the current mirror circuit into voltage;
   a hold circuit including a second hold capacitor which holds a voltage corresponding to the peak current based on the voltage supplied from the current-voltage conversion circuit; and
   a voltage-current conversion circuit which converts the voltage held in the second hold capacitor into current and supplies the converted current to the source/emitter of the correction transistor.

3. The peak hold circuit according to claim 2, wherein:
   the current mirror circuit includes:
   a first transistor which has a drain coupled to the drain of the input transistor; and
   a second transistor which is current-mirror-coupled to the first transistor and has a drain;

the current-voltage conversion circuit includes:
a third transistor which has a drain and gate, both coupled to the drain of the second transistor, and a source; and
a fourth transistor which has a drain and gate both coupled to the source of the third transistor;
the hold circuit includes:
a fifth transistor which has a gate, coupled to the drain of the third transistor, and a source; and
the second hold capacitor coupled to the source of the fifth transistor; and
the voltage-current conversion circuit includes a source-grounded type sixth transistor which has a gate supplied with the voltage held by the second hold capacitor.

4. The peak hold circuit according to claim 3, wherein:
the input transistor and the correction transistor have substantially the same element size;
the first transistor and the second transistor have substantially the same element size;
the third transistor and the fifth transistor have substantially the same element size; and
the fourth transistor and the sixth transistor have substantially the same element size.

5. The peak hold circuit according to claim 2, wherein:
the current mirror circuit includes:
a first transistor which has a collector coupled to the collector of the input transistor; and
a second transistor which is current-mirror-coupled to the first transistor and has a collector;
the current-voltage conversion circuit includes:
a third transistor which has a collector and a base, both coupled to the collector of the second transistor, and an emitter; and
a fourth transistor which has a collector and a base both coupled to the emitter of the third transistor;
the hold circuit includes:
a fifth transistor which has a base, coupled to the collector of the third transistor, and an emitter; and
the second hold capacitor coupled to the emitter of the fifth transistor; and
the voltage-current conversion circuit includes an emitter-grounded type sixth transistor which has a base supplied with the voltage held by the second hold capacitor.

6. The peak hold circuit according to claim 2, wherein:
the peak hold unit further includes a first current source which is coupled in parallel to the first hold capacitor and generates a first droop current; and
the hold circuit further includes a second current source which is coupled in parallel to the second hold capacitor and generates a second droop current.

7. The peak hold circuit according to claim 6, wherein the second current source increases the second droop current to be larger than the first droop current in accordance with a control signal input from an external circuit when a potential difference between the input signal and the hold voltage of the first hold capacitor suddenly increases and then when a given time elapses thereafter equalizes the second droop current with the first droop current in accordance with the control signal.

8. The peak hold circuit according to claim 2, wherein the peak current hold circuit further includes a lowpass filter which filters the voltage supplied from the current-voltage conversion circuit and supplies the filtered voltage to the hold circuit.

9. The peak hold circuit according to claim 2, further comprising:
a sample hold circuit arranged between the current-voltage conversion circuit and the hold circuit, with the sample hold circuit including:
a sample hold capacitor which holds the voltage supplied from the current-voltage conversion circuit;
a first switch which couples and uncouples the current-voltage conversion circuit and the hold circuit, in which the first switch uncouples the current-voltage conversion circuit and the hold circuit in accordance with a control signal input from an external circuit so as to supply the voltage held in the sample hold capacitor to the hold circuit when the potential difference between the input signal and the hold voltage of the first hold capacitor suddenly increases; and
a second switch which couples and uncouples the sample hold capacitor and the hold circuit;
wherein in a normal state in which the potential difference between the input signal and the hold voltage of the first hold capacitor is small, the first switch couples the current-voltage conversion circuit and the hold circuit in accordance with the control signal, and the second switch uncouples the sample hold capacitor and the hold circuit in accordance with the control signal.

10. The peak hold circuit according to claim 2, wherein:
the peak hold unit includes a first current source which is coupled in parallel to the first hold capacitor and which generates a first droop current; and
the peak current hold circuit includes:
a second current source which generates a second droop current; and
a droop boost circuit which detects a sudden change in the hold voltage of the first hold capacitor, boosts the second droop current, and supplies a boost current to the hold circuit.

11. The peak hold circuit according to claim 1, further comprising:
a discharge cancel circuit including:
an inversion circuit which inverts the input signal and generates an inverted signal;
a copy transistor which has substantially the same element size as the input transistor and has a gate/base provided with the inverted signal; and
a copy hold capacitor which is coupled to the first hold capacitor and which holds a peak value of the inverted signal.

12. The peak hold circuit according to claim 11, wherein the inversion circuit includes:
a source/emitter follower circuit provided with the input signal; and
a source/emitter-grounded amplification circuit which amplifies the input signal provided through the source/emitter follower circuit with a given gain, in which the given gain is set to −1 to generate the inverted signal.

13. The peak hold circuit according to claim 1, further comprising:
a second peak hold unit which is arranged between the peak hold unit and the correction circuit and which holds a peak value of the hold voltage held in the first hold capacitor.

* * * * *